(12) United States Patent
Choi et al.

(10) Patent No.: US 12,388,017 B2
(45) Date of Patent: Aug. 12, 2025

(54) SEMICONDUCTOR DEVICES INCLUDING A SOURCE CONTACT PLUG AND A SOURCE CONNECTION PATTERN, AND DATA STORAGE SYSTEMS INCLUDING THE SAME

(71) Applicant: Samsung Electronics Co., Ltd., Suwon-si (KR)

(72) Inventors: Moorym Choi, Yongin-si (KR); Jungtae Sung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 570 days.

(21) Appl. No.: 17/702,137

(22) Filed: Mar. 23, 2022

(65) Prior Publication Data

US 2023/0021449 A1    Jan. 26, 2023

(30) Foreign Application Priority Data

Jul. 13, 2021   (KR) .................. 10-2021-0091672

(51) Int. Cl.
*H10B 41/10*   (2023.01)
*H01L 23/522*   (2006.01)
(Continued)

(52) U.S. Cl.
CPC ...... *H01L 23/5283* (2013.01); *H01L 23/5226* (2013.01); *H10B 41/10* (2023.02);
(Continued)

(58) Field of Classification Search
CPC ........ H10B 41/10; H10B 41/27; H10B 41/35; H10B 41/40; H10B 43/10; H10B 43/27; H10B 43/35; H10B 43/40; H10B 41/50
See application file for complete search history.

(56) References Cited

U.S. PATENT DOCUMENTS

| 10,937,766 B2 | 3/2021 | Liu |
| 10,957,680 B2 | 3/2021 | Yada et al. |

(Continued)

OTHER PUBLICATIONS

Extended European Search Report dated Dec. 23, 2022 for corresponding European Application No. 22182796.7.

*Primary Examiner* — Khiem D Nguyen
(74) *Attorney, Agent, or Firm* — Harness, Dickey & Pierce, P.L.C.

(57) ABSTRACT

A semiconductor device includes: circuit devices on a first substrate; a lower interconnection structure electrically connected to the circuit devices; a lower bonding structure connected to the lower interconnection structure; an upper bonding structure on the lower bonding structure; an upper interconnection structure connected to the upper bonding structure; a second substrate on the upper interconnection structure; gate electrodes between the upper interconnection structure and the second substrate; channel structures penetrating the gate electrodes and each including a channel layer; via patterns on the second substrate; a source contact plug spaced apart from the second substrate on an external side of the second substrate and having an upper surface higher than the second substrate and a lower surface lower than a lowermost gate electrode; and a source connection pattern contacting upper surfaces of each of the via patterns and the upper surface of the source contact plug.

20 Claims, 25 Drawing Sheets

(51) Int. Cl.
　　　*H01L 23/528*　　　(2006.01)
　　　*H10B 41/27*　　　(2023.01)
　　　*H10B 41/35*　　　(2023.01)
　　　*H10B 41/40*　　　(2023.01)
　　　*H10B 43/10*　　　(2023.01)
　　　*H10B 43/27*　　　(2023.01)
　　　*H10B 43/35*　　　(2023.01)
　　　*H10B 43/40*　　　(2023.01)

(52) U.S. Cl.
　　　CPC ............. *H10B 41/27* (2023.02); *H10B 41/35* (2023.02); *H10B 41/40* (2023.02); *H10B 43/10* (2023.02); *H10B 43/27* (2023.02); *H10B 43/35* (2023.02); *H10B 43/40* (2023.02)

(56) References Cited

U.S. PATENT DOCUMENTS

| | | | |
|---|---|---|---|
| 11,469,172 B2* | 10/2022 | Gwon | H10B 43/27 |
| 2012/0199895 A1* | 8/2012 | Nitta | H10B 61/20 |
| | | | 257/E27.005 |
| 2014/0141610 A1 | 5/2014 | Jin et al. | |
| 2018/0261623 A1* | 9/2018 | Higashi | H10B 43/50 |
| 2020/0144242 A1* | 5/2020 | Park | H01L 24/05 |
| 2020/0227397 A1* | 7/2020 | Yada | H10B 43/40 |
| 2020/0266182 A1* | 8/2020 | Nishikawa | G11C 7/12 |
| 2020/0286842 A1 | 9/2020 | Sanuki | |
| 2021/0202458 A1 | 7/2021 | Jung et al. | |
| 2022/0093630 A1* | 3/2022 | Koh | H10B 43/27 |
| 2022/0173118 A1* | 6/2022 | Kang | H10B 41/50 |

* cited by examiner

SEMICONDUCTOR DEVICES INCLUDING A SOURCE CONTACT PLUG AND A SOURCE CONNECTION PATTERN, AND DATA STORAGE SYSTEMS INCLUDING THE SAME

CROSS-REFERENCE TO RELATED APPLICATION

This application claims benefit of priority to Korean Patent Application No. 10-2021-0091672 filed on Jul. 13, 2021 in the Korean Intellectual Property Office, the disclosure of which is incorporated herein by reference in its entirety.

BACKGROUND

The present inventive concepts relate to semiconductor devices and data storage systems including the same.

In a data storage system requiring data storage, there is increasing demand for a semiconductor device which may store high-capacity data. Accordingly, research into methods of increasing data storage capacity of a semiconductor device has been conducted. For example, a semiconductor device including three-dimensionally arranged memory cells, rather than two-dimensionally arranged memory cells, has been proposed as a method of increasing data storage capacity of a semiconductor device.

SUMMARY

Example embodiments provide a semiconductor device having improved electrical characteristics and reliability.

Example embodiments provide a data storage system including a semiconductor device having improved electrical characteristics and reliability.

According to some example embodiments, a semiconductor device may include a first semiconductor structure and a second semiconductor structure. The first semiconductor structure may include a first semiconductor structure including a first substrate, circuit devices on the first substrate, a lower interconnection structure electrically connected to the circuit devices, and a lower bonding structure connected to the lower interconnection structure. The second semiconductor structure may include a second substrate on the first semiconductor structure, gate electrodes spaced apart from each other and stacked in a vertical direction that is perpendicular to a lower surface of the second substrate, channel structures penetrating through the gate electrodes, extending in the vertical direction, each including a channel layer, an upper interconnection structure below the gate electrodes and the channel structures, and an upper bonding structure connected to the upper interconnection structure and bonded to the lower bonding structure. The second semiconductor structure may further include via patterns on the second substrate, a source contact plug spaced apart from the second substrate, and a source connection pattern configured to be in contact with an upper surface of each of the via patterns and to electrically connect the via patterns and the source contact plug to each other. The source connection pattern may include an overlapping portion that overlaps the second substrate in the vertical direction, and an extension portion that extends from the overlapping portion in a horizontal direction that is parallel to the lower surface of the second substrate. The source contact plug may overlap the extension portion of the source connection pattern in the vertical direction.

According to some example embodiments, a semiconductor device may include a first substrate; circuit devices on the first substrate; a lower interconnection structure electrically connected to the circuit devices; a lower bonding structure connected to the lower interconnection structure; an upper bonding structure bonded to the lower bonding structure; an upper interconnection structure connected to the upper bonding structure; a second substrate on the upper interconnection structure; gate electrodes between the upper interconnection structure and the second substrate and where the gate electrodes are spaced apart from each other; channel structures penetrating through the gate electrodes and where each of the channel structures include a channel layer; via patterns on the second substrate; a source contact plug spaced apart from the second substrate on an external side of the second substrate and having an upper surface having a level higher than a level of an upper surface of the second substrate and a lower surface having a level lower than a level of a lower surface of a lowermost gate electrode, among the gate electrodes, based on an upper surface of the first substrate; and a source connection pattern in contact with an upper surface of each of the via patterns and the upper surface of the source contact plug.

According to some example embodiments, a data storage system may include a semiconductor storage device and a controller. The semiconductor storage device may include a first semiconductor structure, a second semiconductor structure, and an input/output pad. The first semiconductor structure may include a first substrate and circuit devices on the first substrate. The second semiconductor structure may include a second substrate, gate electrodes spaced apart from each other and stacked below the second substrate, and channel structures penetrating through the gate electrodes. The input/output pad may be electrically connected to the circuit devices. The controller may be electrically connected to the semiconductor storage device through the input/output pad and may be configured to control the semiconductor storage device. The first semiconductor structure may further include a lower interconnection structure electrically connected to the circuit devices; and a lower bonding structure connected to the lower interconnection structure. The second semiconductor structure may further include an upper bonding structure bonded to the lower bonding structure; an upper interconnection structure connected to the upper bonding structure; via patterns on the second substrate; a source connection pattern configured to be in contact with an upper surface of each of the via patterns and including an overlapping portion that overlaps the second substrate in a vertical direction that is perpendicular to a lower surface of the second substrate, and an extension portion that extends from the overlapping portion in a horizontal direction that is parallel to the lower surface of the second substrate; and a source contact plug connected to the upper interconnection structure, spaced apart from the second substrate on an external side of the second substrate, and extending in the vertical direction to be in contact with the extension portion of the source connection pattern.

BRIEF DESCRIPTION OF THE DRAWINGS

The above and other aspects, features, and advantages of the present inventive concepts will be more clearly understood from the following detailed description, taken in conjunction with the accompanying drawings.

DETAILED DESCRIPTION

Figure 1:
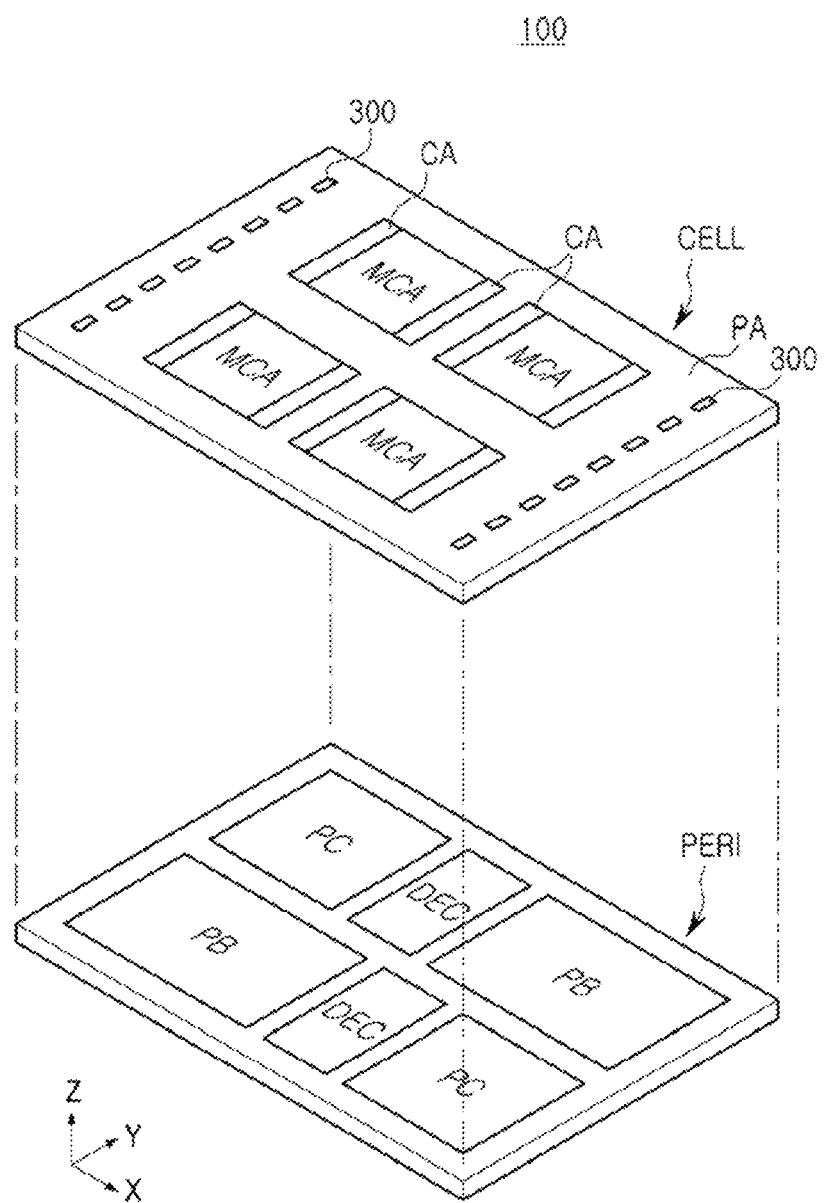
FIG. 1 is a schematic exploded perspective view of a semiconductor device according to some example embodiments.

Hereinafter, some example embodiments will be described with reference to the accompanying drawings.

In the descriptions below, terms "upper," "upper portion," "upper surface," "lower," "lower portion," "lower surface," "side surface," and the like, are used with reference to the diagrams unless otherwise indicated.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 is a schematic exploded perspective view of a semiconductor device according to some example embodiments.

Referring to FIG. 1, a semiconductor device 100 according to some example embodiments may include a peripheral circuit region PERI and a memory cell region CELL stacked in a vertical direction Z. The peripheral circuit region PERI and the memory cell region CELL may be bonded to each other. The memory cell region CELL may include a memory cell array region MCA, a connection region CA adjacent to the memory cell array region MCA, and an external region PA disposed on external sides of the regions MCA and CA. A conductive pad 300, an input/output pad, may be disposed on the external region PA. A memory cell structure, including the memory cell array region MCA and the connection region CA, may include a plurality of memory cell structures.

The peripheral circuit region PERI may include a row decoder DEC, a page buffer PB, and other peripheral circuits PCs. In the peripheral circuit region PERI, the row decoder DEC may decode an input address to generate and transmit driving signals of a wordline. The page buffer PB may be connected to the memory cell array region MCA through bitlines to read information stored in memory cells. The other peripheral circuits PCs may be regions including a control logic and a voltage generator and may include, for example, a latch circuit, a cache circuit, and/or a sense amplifier. The peripheral circuit region PERI may further include an additional pad region. In this case, the pad region may include an electrostatic discharge (ESD) device or a data input/output circuit. The ESD device or data input/output circuit of the pad region may be electrically connected to a conductive pad 300 of the external region PA. The various circuit regions DEC, PB, and PC in the peripheral circuit region PERI may be arranged in various forms.

Figure 2:
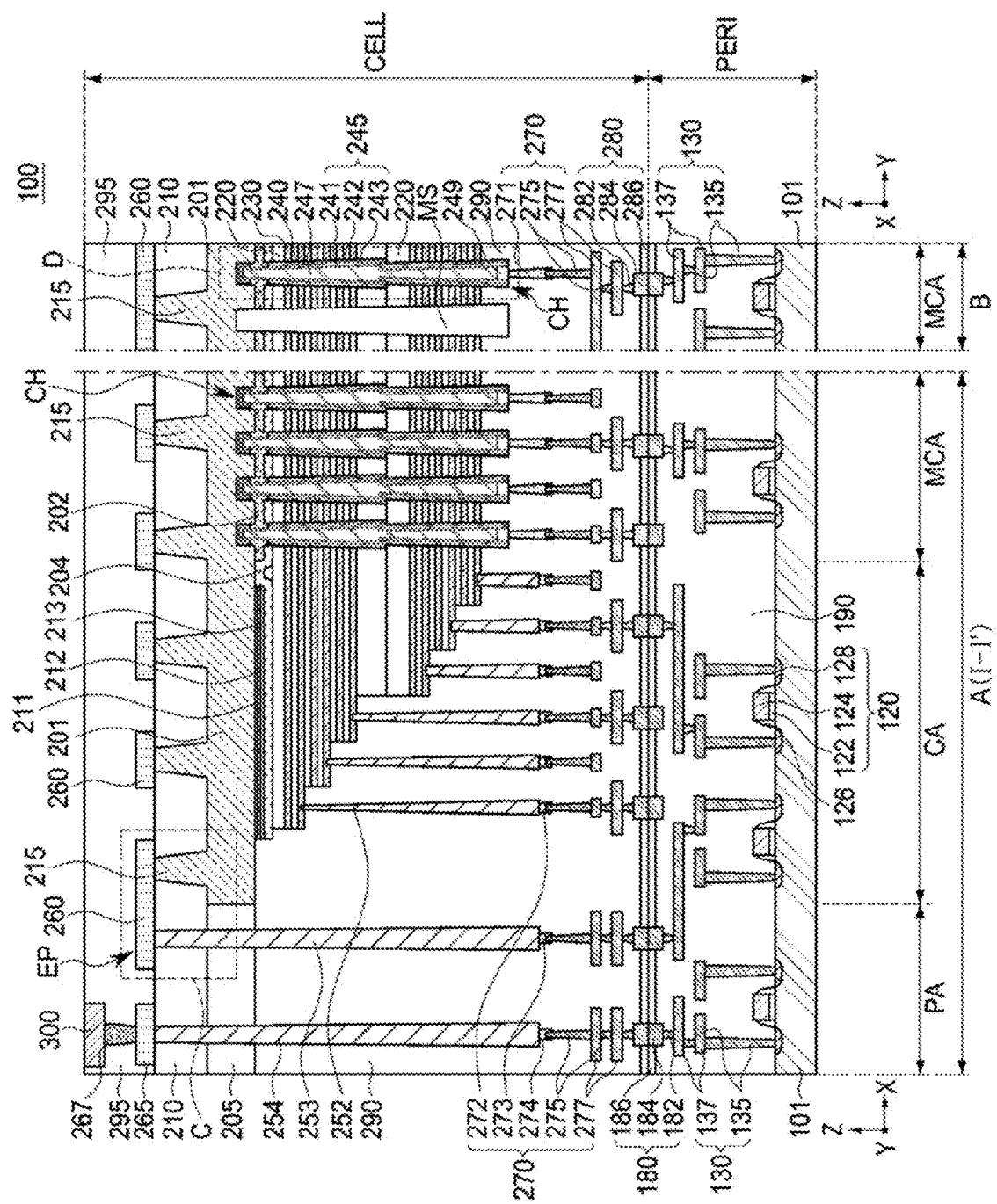
FIG. 2 is a schematic cross-sectional view of a semiconductor device according to some example embodiments.

Hereinafter, an example of the semiconductor device 100 will be described with reference to FIGS. 2 to 4B. In FIG. 2, cross-sectional region "A" of the semiconductor device 100 taken in an X direction may schematically illustrate a portion of the memory cell array region MCA, the connection region CA, and a portion of the external region PA illustrated in FIG. 1, and cross-sectional region "B" of the semiconductor device 100 taken in a Y direction may schematically illustrate a portion of the memory cell array region MCA illustrated in FIG. 1.

FIG. 2 is a schematic cross-sectional view of a semiconductor device according to some example embodiments. In FIG. 2, region "A" may correspond to a cross-section of a semiconductor device taken along line I-I' of FIG. 3.

Figure 3:
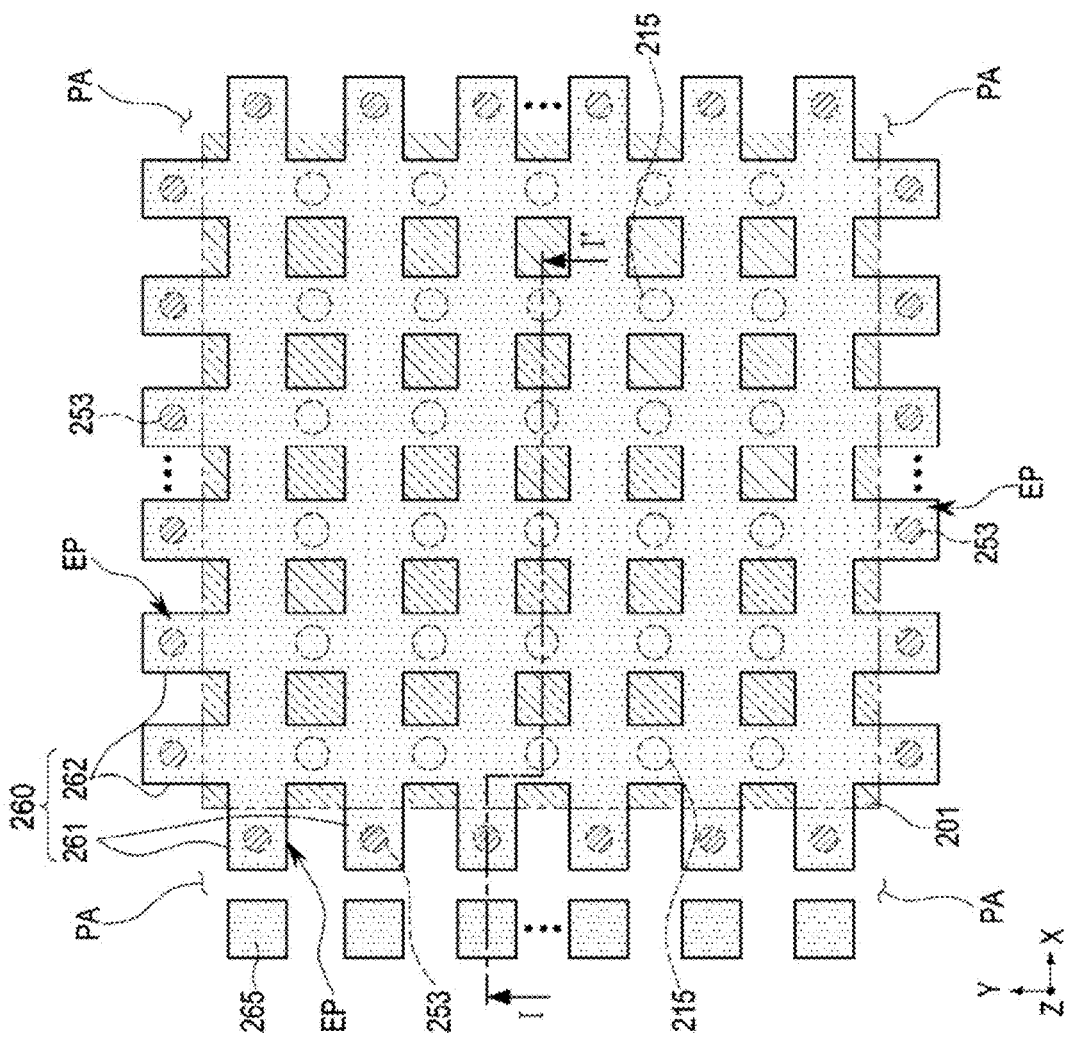
FIG. 3 is a plan view illustrating some components of a semiconductor device according to some example embodiments.

FIG. 3 is a plan view illustrating some components of a semiconductor device according to some example embodiments. FIG. 3 illustrates shapes of a second substrate 201, via patterns 215, a source contact plug 253, and a source connection pattern 260 and a position relationship therebetween to exhibit an electrical connection relationship between the second substrate 201 including a common source line and a source contact plug 253.

Figure 4A:
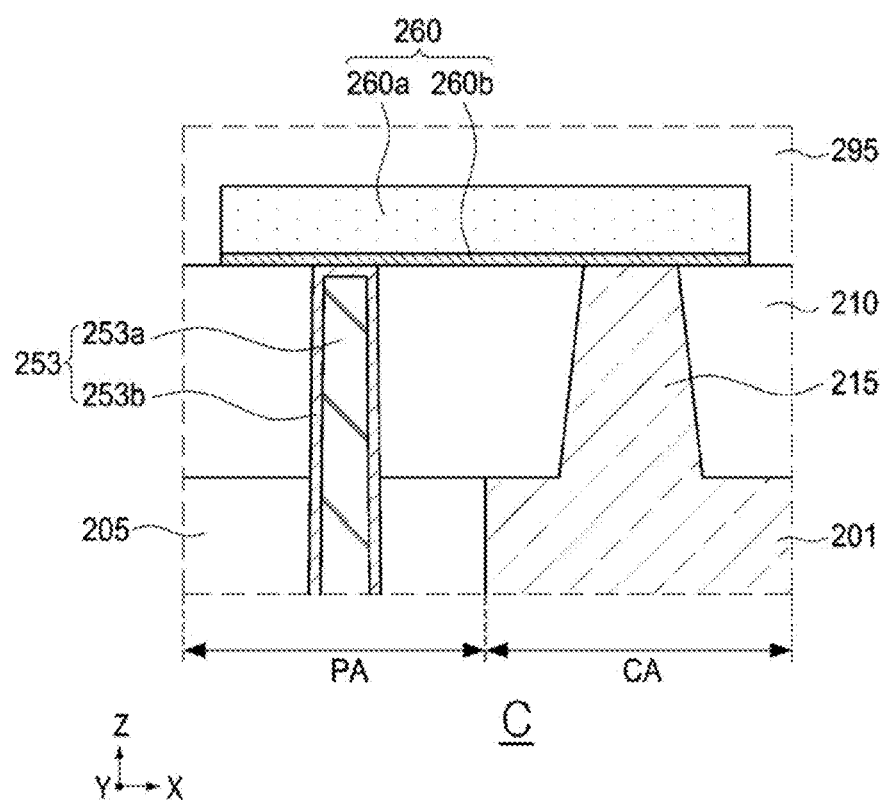
FIGS. 4A and 4B are partially enlarged cross-sectional views of a semiconductor device according to some example embodiments.
Figure 4B:
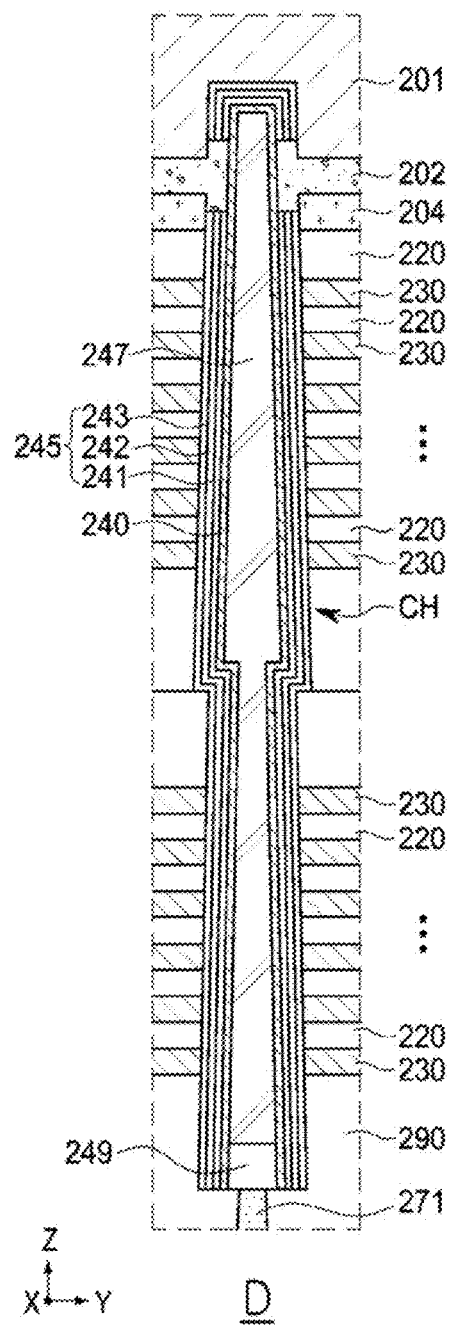

FIGS. 4A and 4B are partially enlarged cross-sectional views of a semiconductor device according to some example embodiments. FIG. 4A is an enlarged view of region "C" of FIG. 2, and FIG. 4B is an enlarged view of region "D" of FIG. 2.

Referring to FIGS. 2 to 4B, the semiconductor device 100 may include a peripheral circuit region PERI and a memory cell region CELL. The memory cell region CELL may be disposed on the peripheral circuit region PERI. The peripheral circuit region PERI and the memory cell region CELL may be bonded to each other through bonding structures 180 and 280. The peripheral circuit region PERI may be referred to as a first semiconductor structure, and the memory cell region CELL may be referred to as a second semiconductor structure.

The peripheral circuit region PERI may include a first substrate 101, and circuit devices 120, a lower interconnection structure 130, a lower bonding structure 180, and a lower capping layer 190 on the first substrate 101.

The first substrate 101 may include a semiconductor material, for example, a group IV semiconductor, a group III-V compound semiconductor, or a group II-VI compound semiconductor. The first substrate 101 may be provided as a bulk wafer or an epitaxial layer. An active region may be defined in the first substrate 101 by device isolation layers. Source/drain regions 128 including impurities may be disposed in a portion of the active region.

The circuit devices 120 may include transistors. Each of the circuit devices 120 may include a circuit gate dielectric layer 122, a circuit gate electrode 124, and a source/drain region 128. Source/drain regions 128 including impurities may be disposed in the first substrate 101 on opposite sides adjacent to the circuit gate electrode 124. The spacer layers 126 may be disposed on opposite sides adjacent to the circuit gate electrode 124. The circuit gate dielectric layer 122 may include silicon oxide, silicon nitride, or a high-k dielectric material. The circuit gate electrode 124 may include at least one of titanium nitride (TiN), tantalum nitride (TaN), tungsten nitride (WN), titanium silicon nitride (TiSiN), tantalum silicon nitride (TaSiN), tungsten silicon nitride (WSiN), tungsten (W), copper (Cu), aluminum (Al), molybdenum (Mo), or ruthenium (Ru). The circuit gate electrode 124 may include a semiconductor layer, for example, a doped polycrystalline silicon layer. In some example embodiments, the circuit gate electrode 124 may have a multilayer structure including two or more layers.

The lower interconnection structure 130 may be electrically connected to the circuit gate electrodes 124 and the source/drain regions 128 of the circuit devices 120. The lower interconnection structure 130 may include lower contact plugs 135, having a cylindrical or truncated conical shape, and lower interconnection lines 137 in which at least one region is in the form of a line. Some of the lower contact plugs 135 may be connected to the source/drain regions 128 and, although not illustrated, the others of the lower contact plugs 135 may be connected to the circuit gate electrodes 124. The lower contact plugs 135 may electrically connect the lower interconnection lines 137, disposed on different levels from an upper surface of the first substrate 101, to each other. The lower interconnection structure 130 may include a conductive material, for example, tungsten (W), copper (Cu), aluminum (Al), and the like. Each of the components may further include a diffusion barrier including at least one of titanium (Ti), nitride (TiN), tantalum (Ta), tantalum nitride (TaN), or tungsten nitride (WN). The number and arrangement of the lower contact plugs 135 and the lower interconnection lines 137, constituting the lower interconnection structure 130, may vary according to some example embodiments.

The lower bonding structure 180 may be connected to the lower interconnection structure 130. The lower bonding structure 180 may include a lower bonding via 182, a lower bonding pad 184, and a lower bonding insulating layer 186. The lower bonding via 182 may be connected to the lower interconnection structure 130. The lower bonding pad 184 may be connected to the lower bonding via 182. The lower bonding via 182 and the lower bonding pad 184 may include a conductive material, for example, tungsten (W), copper (Cu), aluminum (Al), and the like. Each of the components may further include a diffusion barrier. The lower bonding insulating layer 186 may also function as a diffusion barrier of the lower bonding pad 184, and may include at least one of SiCN, SiO, SiN, SiOC, SiON, or SiOCN. The lower bonding insulating layer 186 may have a thickness smaller than a thickness of the lower bonding pad 184, but example embodiments are not limited thereto. The lower bonding structure 180 may be in direct contact with the upper bonding structure 280 to be bonded or connected thereto by hybrid bonding. For example, the lower bonding pad 184 and the upper bonding pad 284 may be in contact with each other to be bonded by copper-to-copper (Cu-to-Cu) bonding, and the lower bonding insulating layer 186 and the upper bonding insulating layer 286 may be in contact with each other to be bonded by dielectric-to-dielectric bonding. The lower bonding structure 180 may provide an electrical connection path between the peripheral circuit region PERI and the memory cell region CELL together with the upper bonding structure 280.

The lower capping layer 190 may be disposed on the first substrate 101 to cover the circuit devices 120 and the lower interconnection structure 130. The lower capping layer 190 may include a plurality of insulating layers. The lower capping layer 190 may include an insulating material, for example, silicon oxide, silicon nitride, silicon oxynitride, or silicon oxycarbide.

The memory cell region CELL includes a second substrate 201, first and second horizontal conductive layers 202 and 204 below the second substrate 201, and via patterns 215 on the second substrate 201, gate electrodes 230 stacked below the second substrate 201, a separation region MS extending through a stack structure of the gate electrodes 230, and channel structures CH disposed to penetrate through the stack structure of the gate electrodes 230, contact plugs 252, 253, and 254 for electrical connection to the peripheral circuit region PERI, a source connection pattern connected to the source contact plug 253, among the contact plugs 252, 253, and 254, an upper interconnection structure 270 below the stack structure, and an upper bonding structure 280 connected to the upper interconnection structure 270. The memory cell region CELL may further include an external insulating layer 205 in contact with an external end portion of the second substrate 201, first to third horizontal sacrificial layers 211, 212, and 213 between the second substrate 201 and the second horizontal conductive layer 204, interlayer insulating layers 220 alternately stacked with the gate electrodes 230 below the second substrate 201, a peripheral contact pad 265 and a peripheral contact via 267 on the peripheral contact plug 254, among the contact plugs 252, 253, and 254, an upper capping layer 290 covering the stack structure, upper insulating layers 210 and 295 on the second substrate 201, and a conductive pad 300 on the peripheral contact via 267.

In the memory cell region CELL, the memory cell array region MCA, the connection region CA, and the external region PA may be defined based on, for example, the second substrate 201 and neighboring components thereof.

As illustrated in FIG. 2, the memory cell array region MCA may be a region in which the gate electrodes 230 are stacked to be spaced apart from each other (e.g., isolated from direct contact with each other) in a vertical direction, for example, a Z direction, and the channel structures CH are disposed. As illustrated in FIG. 2, the connection region CA may be a region in which the gate electrodes 230 extend by different lengths to provide contact pads for electrically connecting the memory cells to the peripheral circuit region PERI. The memory cell array region MCA and the connection region CA may be understood as a region including the second substrate 201 as well as both a region above the second substrate 201 and a region below the second substrate 201.

As illustrated in FIG. 2, the external region PA may indicate a region from an external end portion of the second substrate 201 to an edge of the semiconductor device 100, and may be a region in which a conductive pad 300 and a source contact plug 253, and the peripheral contact plug 254 are disposed. The external region PA may be a region, other than a region in which the memory cell array region MCA and the connection region CA are disposed, in the memory cell region CELL. The external region PA may indicate a region in which the external insulating layer 205 disposed on an external side of the second substrate 201 is disposed, or may indicate a region including the external insulating layer 205 as well as a region below the external insulating layer 205 and a region above the external insulating layer 205.

The second substrate 201 may include a semiconductor material, for example, a group IV semiconductor, a group III-V compound semiconductor, or a group II-VI compound semiconductor. For example, the group IV semiconductor may include silicon (Si), germanium (Ge), or silicon-germanium (SiGe). The second substrate 201 may further include impurities. The second substrate 201 may be provided as a polycrystalline semiconductor layer such as a polycrystalline silicon layer, or an epitaxial layer.

The first and second horizontal conductive layers 202 and 204 may be stacked on a lower surface of the second substrate 201 in the memory cell array region MCA. The first horizontal conductive layer 202 may serve as a portion of a common source line of the semiconductor device 100, for example, as a common source line together with the second substrate 201. The first horizontal conductive layer 202 may penetrate through the gate dielectric layer 245 to be in contact (e.g., direct contact) with a channel layer 240. The first horizontal conductive layer 202 may penetrate through the respective gate dielectric layers 245 of the channel structures CH to be in contact (e.g., direct contact) with the respective channel layers 240 of the channel structures CH. The first horizontal conductive layer 202 may not extend to the connection region CA, and the second horizontal conductive layer 204 may also be disposed in the connection region CA. The second horizontal conductive layer 204 may include a portion bent to be in contact with an end portion of the first horizontal conductive layer 202, and the bent portion may extend to be in contact with the second substrate 201.

The first and second horizontal conductive layers 202 and 204 may include a semiconductor material, for example, polycrystalline silicon. In this case, at least the first horizontal conductive layer 202 may be a layer doped with impurities having the same conductivity type as the second substrate 201, and the second horizontal conductive layer 204 may be a doped layer or a layer including impurities diffused from the first horizontal conductive layer 202. However, the material of the second horizontal conductive layer 204 is not limited to a semiconductor material, and the second horizontal conductive layer 204 may be replaced with an insulating layer.

The first to third horizontal sacrificial layers 211, 212, and 213 may be disposed below the second substrate 201 to be parallel to the first horizontal conductive layer 202 in a portion of the connection region CA. The first to third horizontal sacrificial layers 211, 212, and 213 may be sequentially stacked below the second substrate 201. The first to third horizontal sacrificial layers 211, 212, and 213 may be layers remaining after a portion of the first to third horizontal sacrificial layers 211, 212, and 213 are replaced with the first horizontal conductive layer 202 in the process of fabricating the semiconductor device 100. However, a disposition of the region, in which the first to third horizontal sacrificial layers 211, 212, and 213 remain in the connection region CA, may vary according to some example embodiments.

The first and third horizontal sacrificial layers 211 and 213 and the second horizontal sacrificial layer 212 may include different insulating materials. The first and third horizontal sacrificial layers 211 and 213 may include the same material. For example, the first and third horizontal sacrificial layers 211 and 213 may include the same material as the interlayer insulating layers 220, and the second horizontal sacrificial layer 212 may include the same material as the sacrificial insulating layer 218. The first and third horizontal sacrificial layers 211 and 213 may include silicon oxide, and the second horizontal sacrificial layer 212 may include silicon nitride.

The external insulating layer 205 may be disposed in a region, in which a portion of the second substrate 201 is removed, to be in contact with an external end portion of the second substrate 201. A lower surface of the external insulating layer 205 may be coplanar or substantially coplanar with a lower surface of the second substrate 201, but example embodiments are not limited thereto. The external insulating layer 205 may be formed of an insulating material, and may include, for example, silicon oxide, silicon oxynitride, or silicon nitride.

The via patterns 215 may be disposed on the second substrate 201. The via patterns 215 may include a plurality of via patterns 215 disposed at regular intervals in the X and Y directions. The via patterns 215 may be connected to an upper portion of the second substrate 201, and may extend from the second substrate 201 in a vertical direction, for example, a Z direction. Each of the via patterns 215 may have an upper width and a lower width greater than the upper width. The via patterns 215 may be formed to be integrated with the second substrate 201. The via patterns 215 may constitute a continuous structure together with the second substrate 201, and the via patterns 215 and the second substrate 201 may be formed of the same material, for example, a semiconductor material including impurities having the same conductivity type. In some example embodiments, the via patterns 215 may include a semiconductor material, for example, at least one of silicon (Si) or germanium (Ge). The via patterns 215 may be formed of a doped semiconductor material including impurities. For example, the via patterns 215 may include at least one of boron B), aluminum (Al), gallium (Ga), or indium (In), P-type dopants, or may include at least one of phosphorus (P), arsenic (As), or antimony (Sb), N-type dopants. In some example embodiments, each of the via patterns 215 and the second substrate 201 may include polycrystalline silicon including N-type impurities.

Each of the via patterns 215 may be a bypass via. The via patterns 215 may serve to ground the second substrate 201 and the second horizontal conductive layer 204 during the process of fabricating the semiconductor device 100 to prevent arcing from occurring.

An upper surface of each of the via patterns 215 may be in contact with the source connection pattern 260. The via patterns 215 may serve as a connection contact layer for electrically connecting the second substrate 201 to the source contact plug 253, together with the source connection pattern 260. For example, even when the source contact plug 253 is not directly connected to the second substrate 201, the via patterns 215 and the source connection pattern 260 may provide an electrical connection path between the source contact plug 253 and the second substrate 201. Therefore, the source contact plug 253 and the second substrate 201 may be electrically connected to each other.

The gate electrodes 230 may be vertically spaced apart from each other and stacked below the second substrate 201 to form a stack structure. The gate electrodes 230 may be disposed between the second substrate 201 and the upper interconnection structure 270. The gate electrodes 230 may include electrodes sequentially constituting a ground select transistor, memory cells, and a string select transistor from the second substrate 201. The number of gate electrodes 230, constituting the memory cells, may be determined depending on storage capacity of the semiconductor device 100. According to some example embodiments, the number of the gate electrodes 230 constituting the string select transistor and the number of the gate electrodes 230 constituting the ground select transistor may each be one, or two or more. The gate electrodes 230 constituting the string select transistor and the number of the gate electrodes 230 constituting the ground select transistor may have a structure the same as or different from a structure of the gate electrodes 230 of the memory cells. In addition, the gate electrodes 230 may be disposed below the gate electrode 230 constituting the string select transistor and above the gate electrode 230 constituting the ground select transistor, and may further include a gate electrode 230 constituting an erase transistor used for an erase operation based on gate-induced drain leakage (GIDL).

The gate electrodes 230 may be vertically spaced apart from each other and stacked in the memory cell array region MCA, and may extend from the memory cell array region MCA to the connection region CA by different lengths to from a staircase-shaped step structure. As illustrated in FIG. 2, the gate electrodes 230 may be disposed to have a step structure in the X direction and may also be disposed to have a step structure in the Y direction. Due to the step structure, the gate electrodes 230 may provide end portions exposed from the interlayer insulating layer 220 toward the first substrate 101 while forming a staircase shape in which the upper gate electrode 230 extends further than the lower gate electrode 230. In some example embodiments, the gate electrodes 230 may have an increased thickness on the end portions. Although not illustrated, among the gate electrodes 230, some electrodes constituting the string select transistor may be separated by a separation insulating layer extending in the X direction.

The gate electrodes 230 may constitute a lower gate stack group and an upper gate stack group on the lower gate stack group. The interlayer insulating layer 220, disposed between the lower gate stack group and the upper gate stack group, may have a relatively small thickness, but example embodiments are not limited thereto. In FIG. 2, two stack groups of the gate electrodes 230 are illustrated as being vertically disposed, but example embodiments are not limited thereto and the gate electrodes 230 may constitute a single stack group or a plurality of stack groups.

The gate electrodes 230 may include a metal material, for example, tungsten (W). According to embodiments, the gate electrodes 230 may include polycrystalline silicon or a metal silicide material. In some example embodiments, the gate electrodes 230 may further include a diffusion barrier. For example, the diffusion barrier may include tungsten nitride (WN), tantalum nitride (TaN), titanium nitride (TiN), or combinations thereof.

The interlayer insulating layers 220 may be disposed between the gate electrodes 230. Similarly to the gate electrodes 230, the interlayer insulating layers 220 may be disposed to be spaced apart from each other in a direction, perpendicular to the lower surface of the second substrate 201, and to extend in the X direction. The interlayer insulating layers 220 may include an insulating material such as silicon oxide or silicon nitride.

The separation region MS may be disposed to extend in the X-direction through the gate electrodes 230 in the memory cell array region MCA and the connection region CA. The separation region MS may penetrate through all of the gate electrodes 230, stacked below the second substrate 201, to be connected to the second substrate 201. The separation region MS may have a shape in which a width thereof is decreased in a direction toward the second substrate 201 due to a high aspect ratio. The separation region MS may extend in the X direction to separate the gate electrodes 230 from each other in the Y direction. The separation region MS may include an insulating material such as silicon oxide or silicon nitride.

The channel structures CH may each constitute a single memory cell string, and may be disposed to be spaced apart from each other in rows and columns on the memory cell array region MCA. The channel structures CH may be disposed to form a grid pattern in an X-Y plane or may be disposed in a zigzag pattern in one direction. The channel structures CH may extend in the Z direction and may have a columnar shape. Also, the channel structures CH may have inclined side surfaces having widths decreased in a direction toward the second substrate 201 according to an aspect ratio.

Each of the channel structures CH may have a form in which lower and upper channel structures, respectively penetrating through the lower gate stack group and the upper gate stack group of the gate electrodes 230, are connected to each other, and may have a bent portion formed by a difference or change in width in a connection region.

As illustrated in FIG. 4B, a channel layer 240 may be disposed in the channel structures CH. The channel layer 240 of the lower channel structure and the channel layer 240 of the upper channel structure may be in the state of being connected to each other. In the channel structures CH, the channel layer 240 may be formed in an annular shape surrounding a core insulating layer 247 therein, but may have a columnar shape such as a cylindrical shape or a prismatic shape without the core insulating layer 247 according to some example embodiments. The channel layer 240 may be connected to the first horizontal conductive layer 202 thereabove. The channel layer 240 may include a semiconductor material such as polycrystalline silicon or single-crystalline silicon.

Channel pads 249 may be disposed below the channel layer 240 in the channel structures CH. The channel pads 249 may cover a lower surface of the core insulating layer 247 and may be in contact with the channel layer 240. The channel pads 249 may include, for example, doped polycrystalline silicon.

The gate dielectric layer 245 may be disposed between the gate electrodes 230 and the channel layer 240. The gate dielectric layer 245 may be disposed between the second substrate 201 and the channel layer 240. The gate dielectric layer 245 may include a tunneling layer 241, a data storage layer 242, and a blocking layer 243 sequentially stacked from the channel layer 240, as illustrated in FIG. 4B. The tunneling layer 241 may tunnel charges to the data storage layer 242, and may include, for example, silicon oxide ($SiO_2$), silicon oxynitride (SiON), or a combination thereof. The data storage layer 242 may include silicon nitride ($Si_3N_4$) and may be a charge trap layer. The blocking layer 243 may include silicon oxide ($SiO_2$), silicon oxynitride (SiON), a high-k dielectric material, or combinations thereof. In some example embodiments, at least a portion of the gate dielectric layer 245 may extend in a horizontal direction along the gate electrodes 230.

Each of the contact plugs 252, 253, and 254 may have a cylindrical or truncated conical shape, and may have a width decreased in a direction toward an upper portion thereof due to an aspect ratio. The contact plugs 252, 253, and 254 may penetrate through a portion of the upper capping layer 290. The contact plugs 252, 253, and 254 may include a gate contact plug 252, a source contact plug 253, and a peripheral contact plug 254. The gate contact plug 252, the source contact plug 253, and the peripheral contact plug 254 may be disposed to be spaced apart from each other, and may each be provided in plurality. Each of the contact plugs 252, 253, and 254 may include a conductive layer and a barrier layer surrounding side surfaces and one end of the conductive layer. For example, as illustrated in FIG. 4A, the source contact plug 253 may include a conductive layer 253a and a barrier layer 253b, and the barrier layer 253b may surround an upper surface and side surfaces of the conductive layer 253a. The conductive layer 253a may include a conductive material, for example, a metal material such as tungsten (W), copper (Cu), or aluminum (Al). The barrier layer 253b may include at least one of, for example, titanium (Ti), titanium nitride (TiN), tantalum (Ta), tantalum nitride (TaN), tungsten nitride (WN), or tungsten carbon nitride (WCN).

The gate contact plugs 252 may be disposed in the connection region CA to extend in a vertical direction, for example, a Z direction. The gate contact plugs 252 may be connected to end portions, formed by the staircase shape of the gate electrodes 230, or contact pads, respectively. The gate contact plugs 252 may be connected to the upper interconnection structure 270 therebelow.

The source contact plug 253 may be spaced apart from the second substrate 201 on an external side of the second substrate 201 and may extend in the vertical direction, for example, the Z direction. Based on the upper surface of the first substrate 101, the upper surface of the source contact plug 253 may be disposed on a level higher than a level of the upper surface of the second substrate 201. Based on the upper surface of the first substrate 101, the upper surface of the source contact plug 253 may be disposed at the same level or substantially the same level as the upper surface of at least one of the via patterns 215. The source contact plug 253 may penetrate through the external insulating layer 205 and the first upper insulating layer 210 to be connected to the source connection pattern 260. For example, an upper surface of the source contact plug 253 may be in contact with an extension portion EP of the source connection pattern 260. Based on the upper surface of the first substrate 101, a lower surface of the source contact plug 253 may be disposed at a level lower than a level of a lowermost gate electrode 230, among the gate electrodes 230. The lower surface of the source contact plug 253 may be connected to the upper interconnection structure 270. An upper surface of the source contact plug 253 may have a width narrower than a level of the lower surface of the source contact plug 253. The source contact plug 253 may be formed in the same process as the peripheral contact plug 254, and may have a shape the same as similar to that of the peripheral contact plug 254.

In the present specification, the term 'level' may mean a vertical height and/or a distance from a reference location (e.g., one or more of the upper surface of the first substrate 101 the lower surface of the first substrate 101, the lower surface of the second substrate 201, and/or the upper surface of the second substrate) in a vertical direction (e.g., the Z direction, which may be a vertical direction that extends perpendicular or substantially perpendicular to at least one of the upper surface of the first substrate 101, the lower surface of the first substrate 101, the lower surface of the second substrate 201, or the upper surface of the second substrate). A reference location may be understood to be a location that a level and/or relative level of an element is "based on." For example, when a first element is described herein to be at a level higher than a level of a second element based on the upper surface of the first substrate 101, the first element may be further from the upper surface of the first substrate 101 in the vertical direction (e.g., Z direction) than the second element. In another example, when a first element is described herein to be at a level lower than a level of a second element based on the upper surface of the first substrate 101, the first element may be closer to the upper surface of the first substrate 101 in the vertical direction than the second element. In another example, when a first element is described herein to be at a same or substantially same level as a second element based on the upper surface of the first substrate 101, the first element may be equally distant from/close to the upper surface of the first substrate 101 in the vertical direction as the second element.

The peripheral contact plug 254 may be spaced apart from the second substrate 201 and the source contact plug 253 on an external side of the second substrate 201, and may extend in the vertical direction, for example, the Z direction. The peripheral contact plug 254 may penetrate through the external insulating layer 205 and the first upper insulating layer 210 to be connected to a peripheral contact pad 265. An upper surface of the peripheral contact plug 254 may be in contact with the peripheral contact pad 265. The peripheral contact plug 254 may be connected to the upper interconnection structure 270. Based on the upper surface of the first substrate 101, the upper surface of the peripheral contact plug 254 and the upper surface of the source contact plug 253 may be disposed on the same level or substantially the same level.

The source connection pattern 260 may be disposed on the second substrate 201. The source connection pattern 260 may be disposed at a level higher than that of the upper surface of the second substrate 201, based on the upper surface of the first substrate 101. The source connection pattern 260 may electrically connect the via patterns 215 and the source contact plug 253 to each other. As illustrated in FIG. 4A, the source connection pattern 260 may include a conductive layer 260a and a barrier layer 260b, and the conductive layer 260a may be disposed on the barrier layer 260b. The via patterns 215 and the source contact plug 253 may be in contact with the barrier layer 260b. The conductive layer 260a may include a conductive material, for example, a metal material such as tungsten (W), copper (Cu), or aluminum (Al), and the barrier layer 260b may include at least one of, for example, titanium (Ti), titanium nitride (TiN), tantalum (Ta), tantalum nitride (TaN), tungsten nitride (WN), or tungsten carbon nitride (WCN).

As illustrated in FIG. 3, the source connection pattern 260 may include a region having a grid-type or mesh-type pattern on the upper surface of the second substrate 201. For example, the source connection pattern 260 may include first patterns 261, extending in the X direction, and second patterns 262 extending in the Y direction in a plan view. The first patterns 261 and the second patterns 262 may intersect each other, and may be integrally formed to be connected to each other (e.g., such that the first patterns 261 and the second patterns 262 may be portions of a single, unitary piece of material). Due to such a shape of the source connection pattern 260, that stress caused by the metal material layer of the source connection pattern 260 may be dispersed and warpage of the semiconductor device may be controlled. The via patterns 215 may be disposed to be connected to at least one of the first patterns 261 and the second patterns 262 (e.g., at least one pattern of the first patterns 261 and the second patterns 262).

As illustrated in FIGS. 2 and 3, the source connection pattern 260 may include an extension portion EP extending upwardly of the external region PA of the second substrate 201. The extension portion EP may horizontally extend from an overlapping portion in which the source connection pattern 260 overlaps the second substrate 201 in the vertical direction Z. The extended portion EP may overlap a portion of the external insulating layer 205 in the vertical direction Z, and may not overlap the second substrate 201 in the vertical direction Z. At least one of the first patterns 261 and the second patterns 262 (e.g., at least one pattern of the first patterns 261 and the second patterns 262) may include an extension portion EP extending in a direction farther away from the second substrate 201 than an external end of the second substrate 201. In FIG. 3, the extension portion EP may be provided as a plurality of extension portions EP disposed on the external region PA on opposite sides of the first patterns 261 in the X direction, and may be provided as a plurality of extension portions EP on the external region PA on opposite sides of the second patterns 262 in the Y direction. The extension portion EP of the source connection pattern 260 may be directly connected to the source contact plug 253.

When the source contact plug 253 is directly connected to an edge portion of the second substrate 201, the semiconductor material layer of the second substrate 201 may provide an electrical connection path from the edge portion of the second substrate 201 to the channel structure CH of the memory cell array region MCA. The electrical connection path may have a length from the edge portion of the second substrate 201 to the channel structure CH of the memory cell array region MCA. In this case, since the semiconductor material layer has relatively higher electrical resistance than the metal material layer, noise generated by a resistance element of the second substrate 201 may prevent an operation (for example, a read operation) of a memory cell from being performed. For example, when current flows to a common source line of the second substrate 201, a resistance element of the second substrate 201 may cause a decrease in voltage in the common source line, so that the read operation of the memory cell may not be normally performed. According to some example embodiments, the source contact plug 253 may be directly connected to the source connection pattern 260 formed of a metal material and the source connection pattern 260 may be widely formed on the upper surface of the second substrate 201 to electrically connect the source contact plug 253 to the second substrate 201. Accordingly, the metal material layer of the source connection pattern 260 having relatively low electrical resistance may provide an electrical connection path from the source contact plug 253 of the external region PA to the channel structure CH of the memory cell array region MCA. Hence, a length of the electrical connection path formed by the semiconductor material layer of the second substrate 201 having relatively high electrical resistance may be decreased. Accordingly, since the resistance component of the common source line of the second substrate 201 may be reduced, noise generated by the common source line during an operation of the memory cell may be reduced and electrical characteristics and reliability of the semiconductor device may be improved, which may thereby improve operating performance of the semiconductor device and which may improve operating performance and/or reliability of any system and/or device in which the semiconductor device may be included.

The peripheral contact pad 265 and the peripheral contact via 267 may be disposed on the peripheral contact plug 254. The peripheral contact pad 265 may be spaced apart from the source connection pattern 260 in the external region PA. The peripheral contact pad 265 may be in contact with an upper surface of the peripheral contact plug 254. The peripheral contact via 267 may be disposed on the peripheral contact pad 265 and may be connected to the conductive pad 300. A width of a lower region of the peripheral contact via 267 may be narrower than a width of an upper region of the peripheral contact via 267. The peripheral contact pad 265 and the peripheral contact via 267 may include the same material as the source connection pattern 260. In some example embodiments, the peripheral contact via 267 may include aluminum (Al).

The upper interconnection structure 270 may electrically connect the gate electrodes 230, the channel structures CH, the second substrate 201, and the conductive pad 300 to the circuit devices 120. The upper interconnection structure 270 may include a channel contact plug 271, a gate contact stud 272, a source contact stud 273, a peripheral contact stud 274, an upper contact plug 275, and an upper interconnection line 277. The channel contact plug 271 may be connected to the channel pad 249 of the channel structure CH. The channel contact plug 271 may be electrically connected to the channel layer 240 through the channel pads 249 of the channel structures CH in the memory cell array region MCA. The gate contact stud 272 may be connected to the gate contact plug 252. The source contact stud 273 may be connected to the source contact plug 253. The peripheral contact stud 274 may be connected to the peripheral contact plug 254. The upper contact plug 275 may have a cylindrical or truncated conical shape, and at least one region of the upper interconnection line 277 may have a line shape. The upper contact plugs 275 may be connected to the channel contact plug 271, the gate contact stud 272, the source contact stud 273, and the peripheral contact stud 274, respectively. The upper interconnection line 277 may be connected to the upper contact plug 275. The upper interconnection structure 270 may include a conductive material, for example, tungsten (W), copper (Cu), aluminum (Al), or the like. Each of the components may further include a diffusion barrier including at least one of titanium (Ti), titanium nitride (TiN), tantalum (Ta), tantalum nitride (TaN), or tungsten nitride (WN). The number and arrangement of the upper contact plugs 275 and the upper interconnection lines 277, constituting the upper interconnection structure 270, may vary according to some example embodiments.

The upper bonding structure 280 may be connected to the upper interconnection structure 270. The upper bonding structure 280 may include an upper bonding via 282, an upper bonding pad 284, and an upper bonding insulating layer 286. The upper bonding via 282 may be connected to the upper interconnection structure 270. The upper bonding pad 284 may be connected to the upper bonding via 282. The upper bonding via 282 and the upper bonding pad 284 may include a conductive material, for example, tungsten (W), copper (Cu), aluminum (Al), or the like. Each of the components may further include a diffusion barrier. The upper bonding insulating layer 286 may also function as a diffusion barrier of the upper bonding pad 284, and may include at least one of SiCN, SiO, SiN, SiOC, SiON, or SiOCN. The upper bonding insulating layer 286 may have a thickness smaller than that of the upper bonding pad 284, but example embodiments are not limited thereto.

The upper capping layer 290 may be disposed below the second substrate 201 to cover the second substrate 201, the external insulating layer 205, and the gate electrodes 230. The upper capping layer 290 may include a plurality of insulating layers. The upper capping layer 290 may include an insulating material, for example, silicon oxide, silicon nitride, silicon oxynitride, or silicon oxycarbide.

The upper insulating layers 210 and 295 may be disposed on the second substrate 201. The upper insulating layers 210 and 295 may include a first upper insulating layer 210, covering side surfaces of the via patterns 215, and a second upper insulating layer 295 on the first upper insulating layer 210. The second upper insulating layer 295 may cover the source connection pattern 260 and the peripheral contact pad 265. The upper insulating layers 210 and 295 may include an insulating material, for example, silicon oxide, silicon nitride, silicon oxynitride, or silicon oxycarbide.

The conductive pad 300 may serve as an input/output pad of the semiconductor device 100 and may be electrically connected to a controller. The conductive pad 300 may be in contact with the peripheral contact via 267. The conductive pad 300 may be electrically connected to the circuit devices 120 in the peripheral circuit region PERI. The conductive pad 300 may include the same material as the source connection pattern 260. In some example embodiments, the conductive pad 300 may include aluminum (Al).

Figure 5:
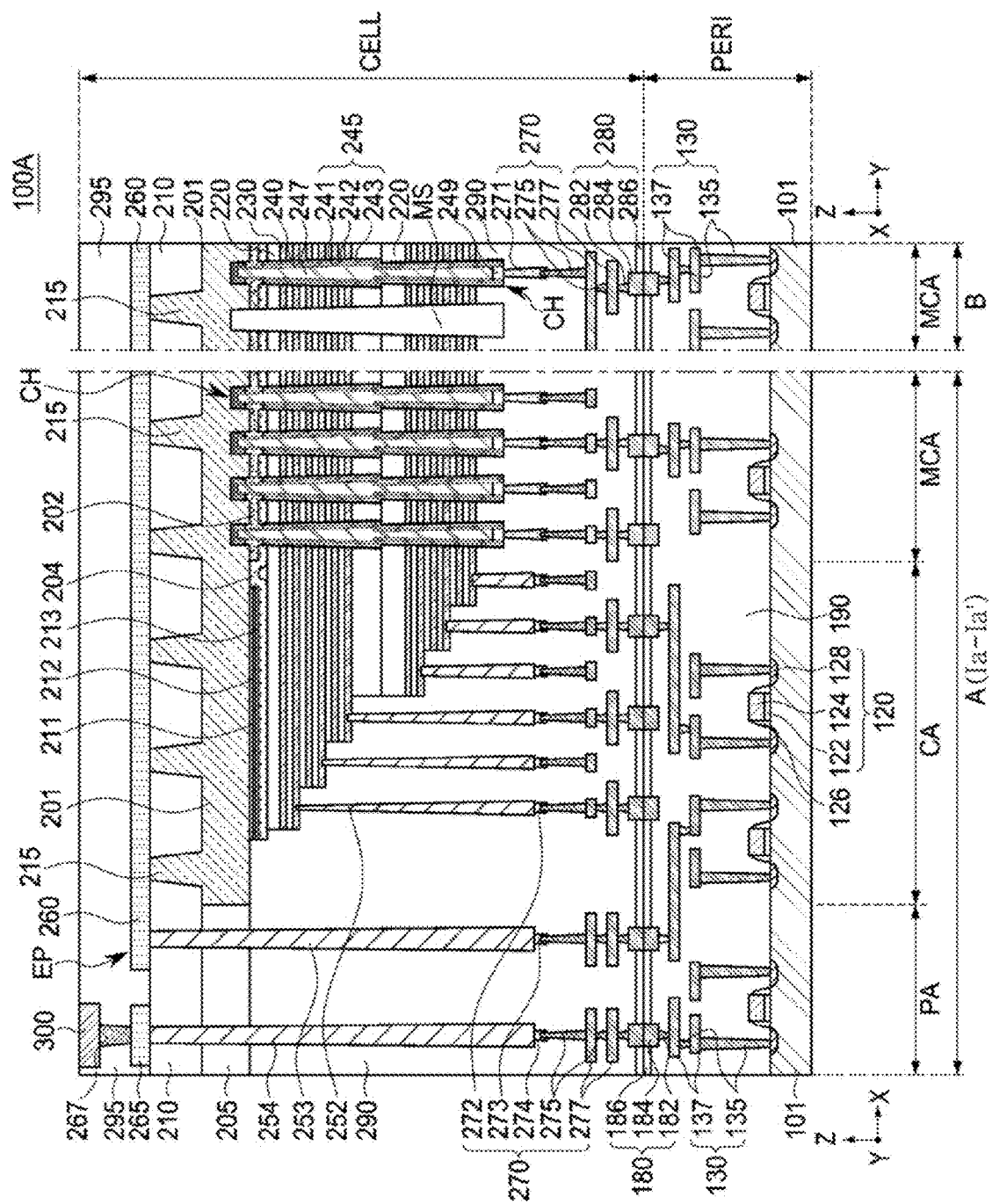
FIG. 5 is a schematic cross-sectional view of a semiconductor device according to some example embodiments.

FIG. 5 is a schematic cross-sectional view of a semiconductor device according to some example embodiments. In FIG. 5, region "A" may correspond to a cross-section of the semiconductor device taken along line Ia-Ia' of FIG. 6.

Figure 6:
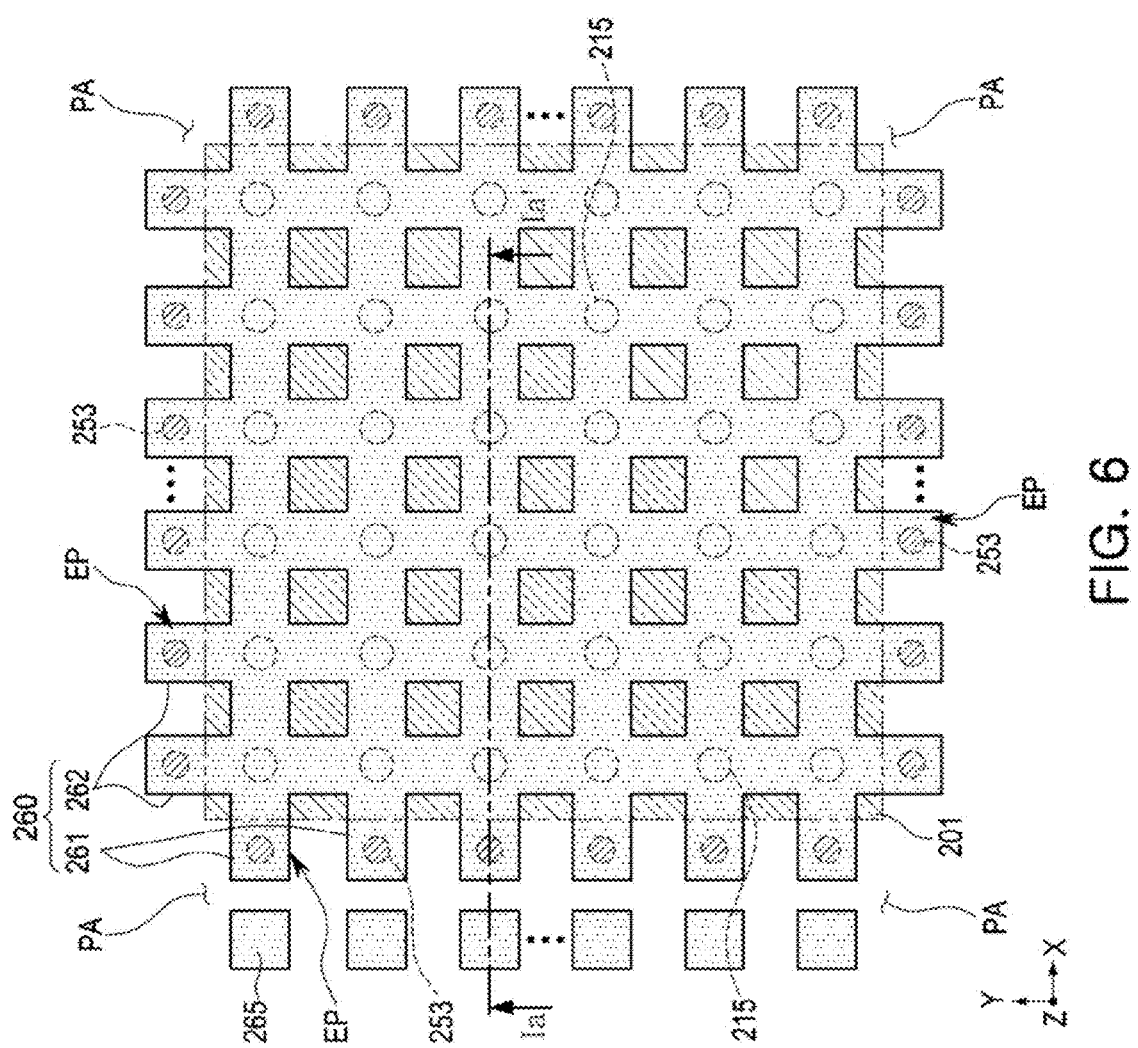
FIG. 6 is a plan view illustrating some components of a semiconductor device according to some example embodiments.

FIG. 6 is a plan view illustrating some components of a semiconductor device according to some example embodiments. FIG. 6 illustrates a region corresponding to FIG. 3.

Referring to FIGS. 5 and 6, a disposition of patterns in the semiconductor device 100A may be partially different from that some example embodiments, including the example embodiments shown in FIGS. 2 to 4B. For example, in the semiconductor device 100A, the via patterns 215 may be disposed to be directly connected to regions in which a first pattern 261 and a second pattern 262 intersect each other. The via patterns 215 may be disposed on the same straight line as the first patterns 261, and may be disposed on the same straight line as the second patterns 262. However, such a disposition is an example, and a disposition relationship between the via patterns 215 and the source connection pattern 260 and shapes thereof may vary according to some example embodiments and will be further described with reference to FIGS. 8A to 8F below.

Figure 7:
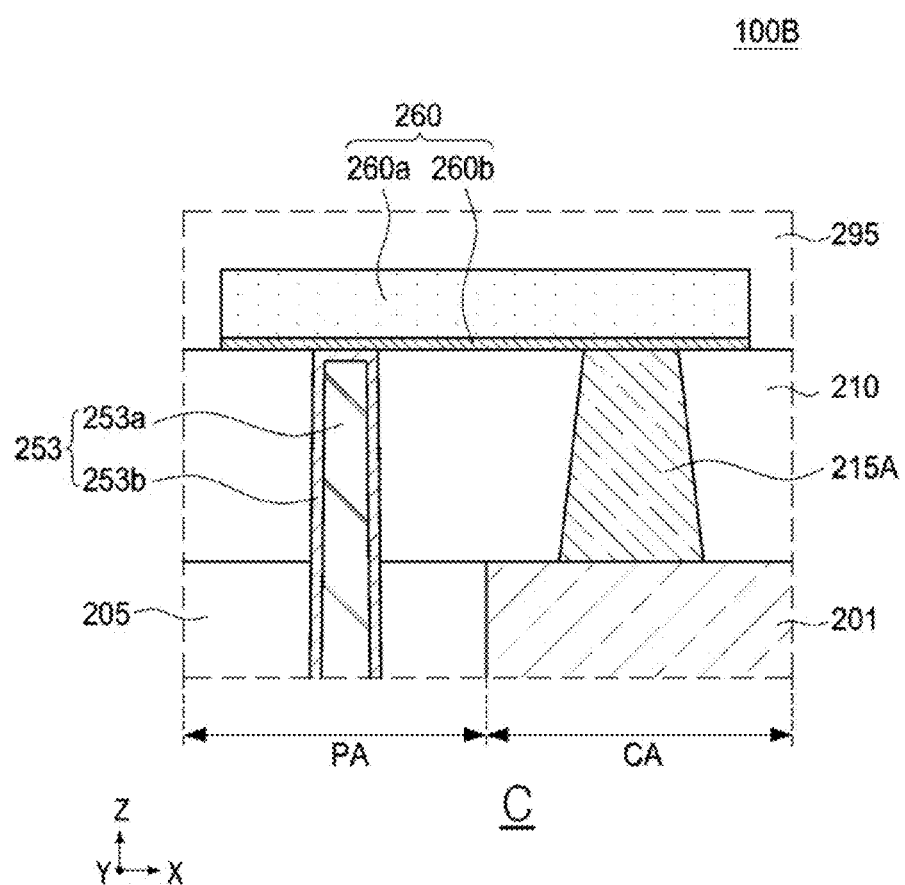
FIG. 7 is a partially enlarged cross-sectional view of a semiconductor device according to some example embodiments.

FIG. 7 is a partially enlarged cross-sectional view of a semiconductor device according to some example embodiments. FIG. 7 is an enlarged view illustrating a region corresponding to region "C" of FIG. 2.

Referring to FIG. 7, via patterns 215A of a semiconductor device 100B may include a material different from that of a second substrate 201. For example, the via patterns 215A may include at least one of metal materials such as aluminum (Al), copper (Cu), tungsten (W), cobalt (Co), ruthenium (Ru), and/or molybdenum (Mo) and/or metal nitrides such as titanium nitride (TiN), tantalum nitride (TaN), and/or tungsten nitride (WN). The second substrate 201 may include a semiconductor material. Since the via patterns 215A include a metal material, contact resistance may be decreased as compared with the case in which the via patterns 215A include a semiconductor material. The via patterns 215A may not be formed to be integrated with the second substrate 201, and the second substrate 201 may be formed after forming the via patterns 215A and then performing a planarization process. In this case, boundaries between the via patterns 215A and the second substrate 201 may be distinguished from each other.

FIGS. 8A, 8B, 8C, 8D, 8E, and 8F are plan views illustrating some components of a semiconductor device according to some example embodiments. FIGS. 8A to 8F illustrate a region corresponding to FIG. 3.

Figure 8A:
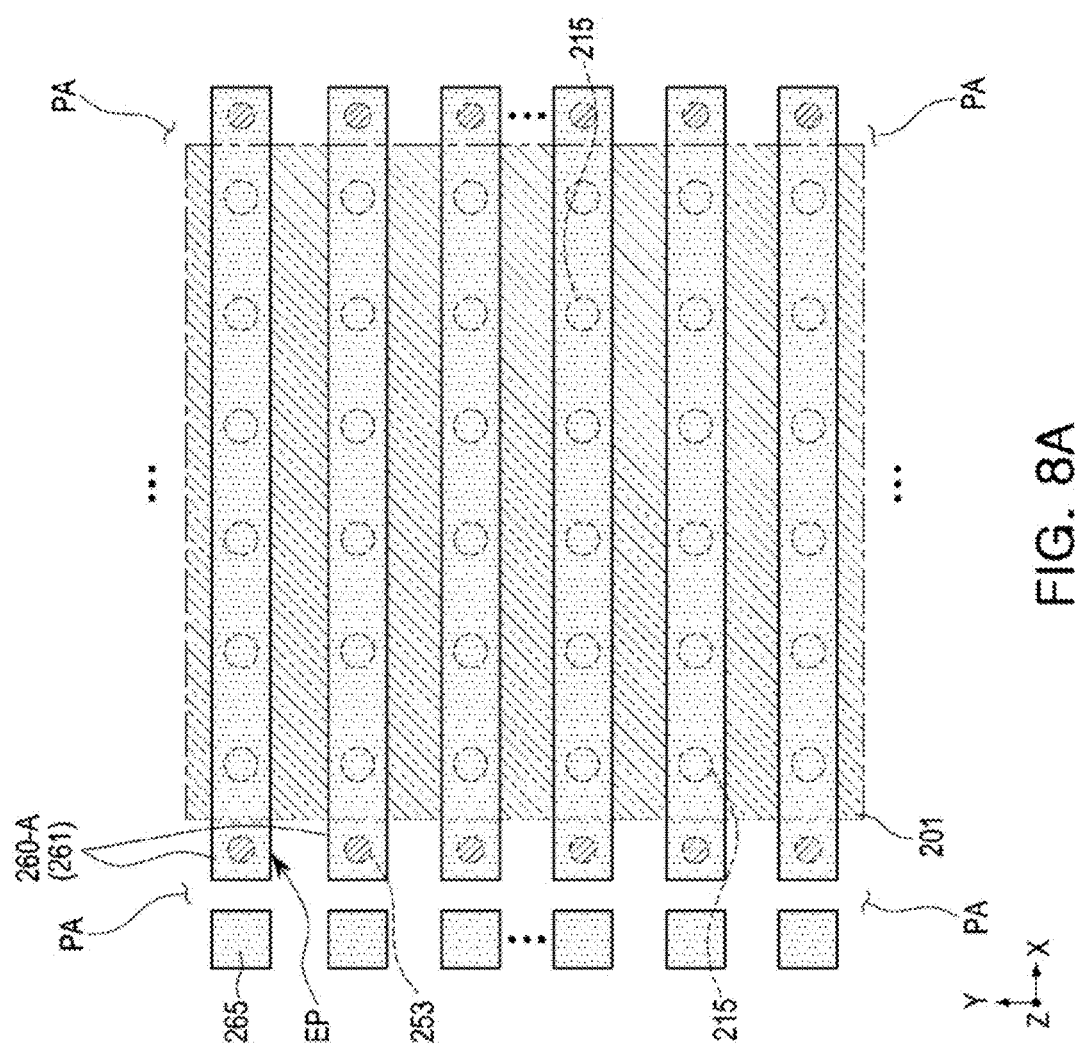
FIGS. 8A, 8B, 8C, 8D, 8E, and 8F are plan views illustrating some components of a semiconductor device according to some example embodiments.

Referring to FIG. 8A, a source connection pattern 260-A may include first patterns 261 extending in an X direction, and first patterns 261 may be electrically connected to a second substrate 201 through via patterns 215 disposed therebelow. The first patterns 261 may have a line shape in a plan view. The first patterns 261 may include extension portions EP extending from both sides in the X direction to an external region PA, and each of the extension portions EP may be directly connected to a source contact plug 253.

Figure 8B:
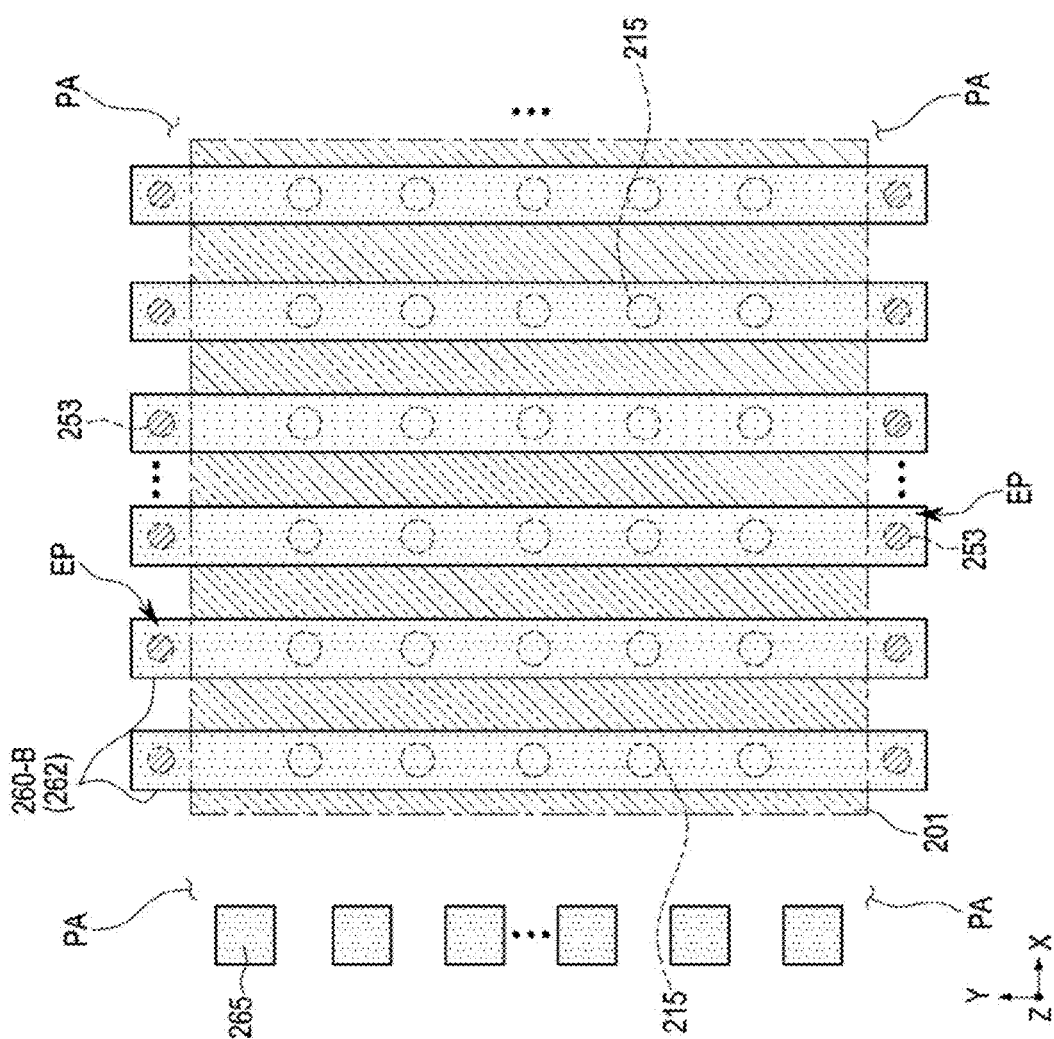

Referring to FIG. 8B, a source connection pattern 260-B may include second patterns 262 extending in a Y direction, and the second patterns 262 may be electrically connected to a second substrate 201 through via patterns 215 disposed therebelow. The second patterns 262 may have a line shape in plan view. The second patterns 262 may include extension portions EP extending from both sides in a Y direction to an external region PA, and each of the extension portions EP may be directly connected to the source contact plug 253.

Figure 8C:
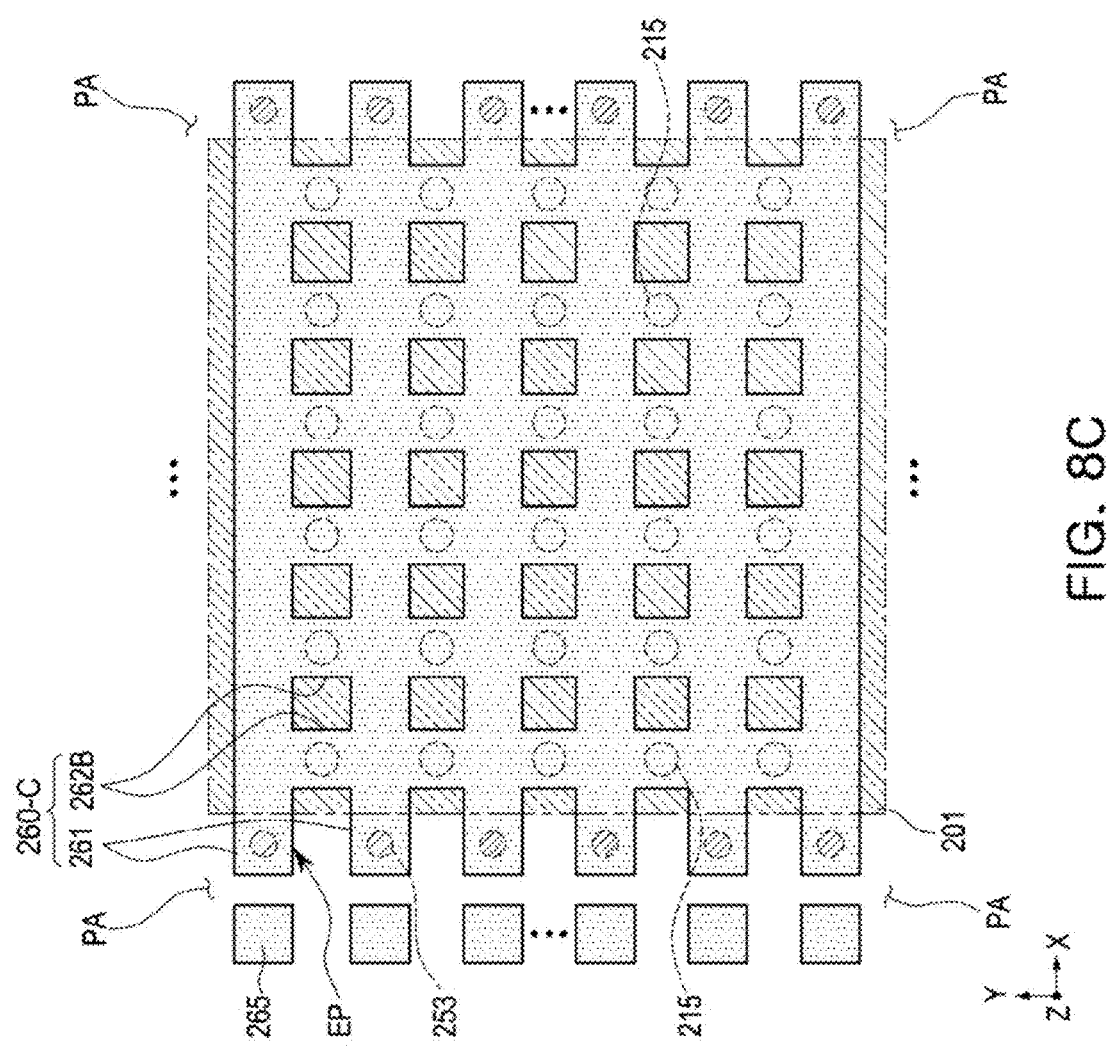

Referring to FIG. 8C, a source connection pattern 260-C may include extension portions EP in which first patterns 261 extend from both sides in an X direction to the external region PA, and the second patterns 262B may not extend to the external region PA. The second patterns 262B may be disposed between the first patterns 261 to serve as a bridge connecting the first patterns 261 to each other.

Figure 8D:
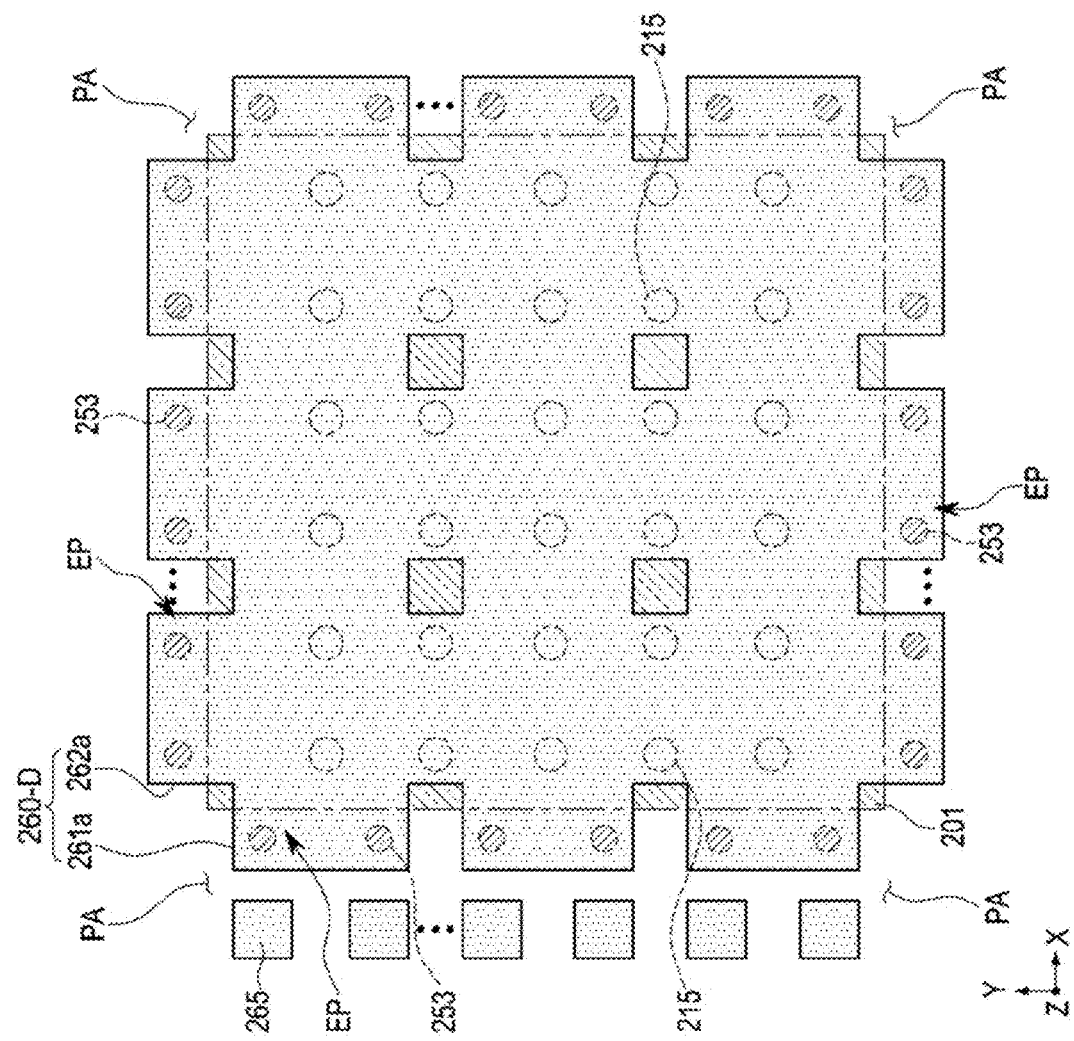

Referring to FIG. 8D, a plurality of, for example, two source contact plugs 253 may be disposed on each extension portion EP of a source connection pattern 260-D. A first pattern 261a and a second pattern 262a of the source connection pattern 260-D may have widths narrower than those of the first pattern 261 and the second pattern 262 of the previous embodiment, respectively.

Figure 8E:
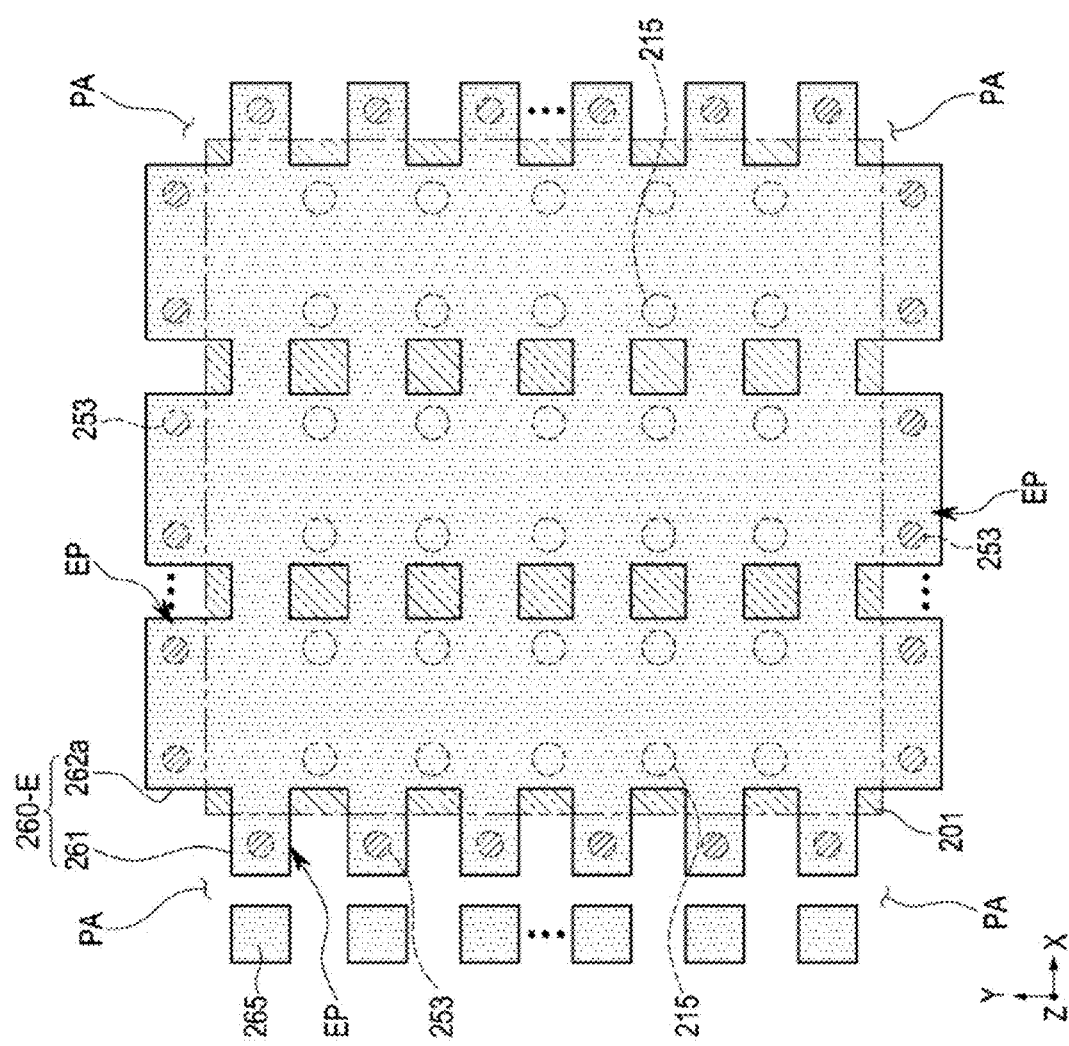

Referring to FIG. 8E, a plurality, for example, two source contact plugs 253 may be disposed in an extension portion EP of each of first patterns 261 or second patterns 262a of a source connection pattern 260-E. For example, each of the second patterns 262a may have a width greater than a width of each of the first patterns 261.

Figure 8F:
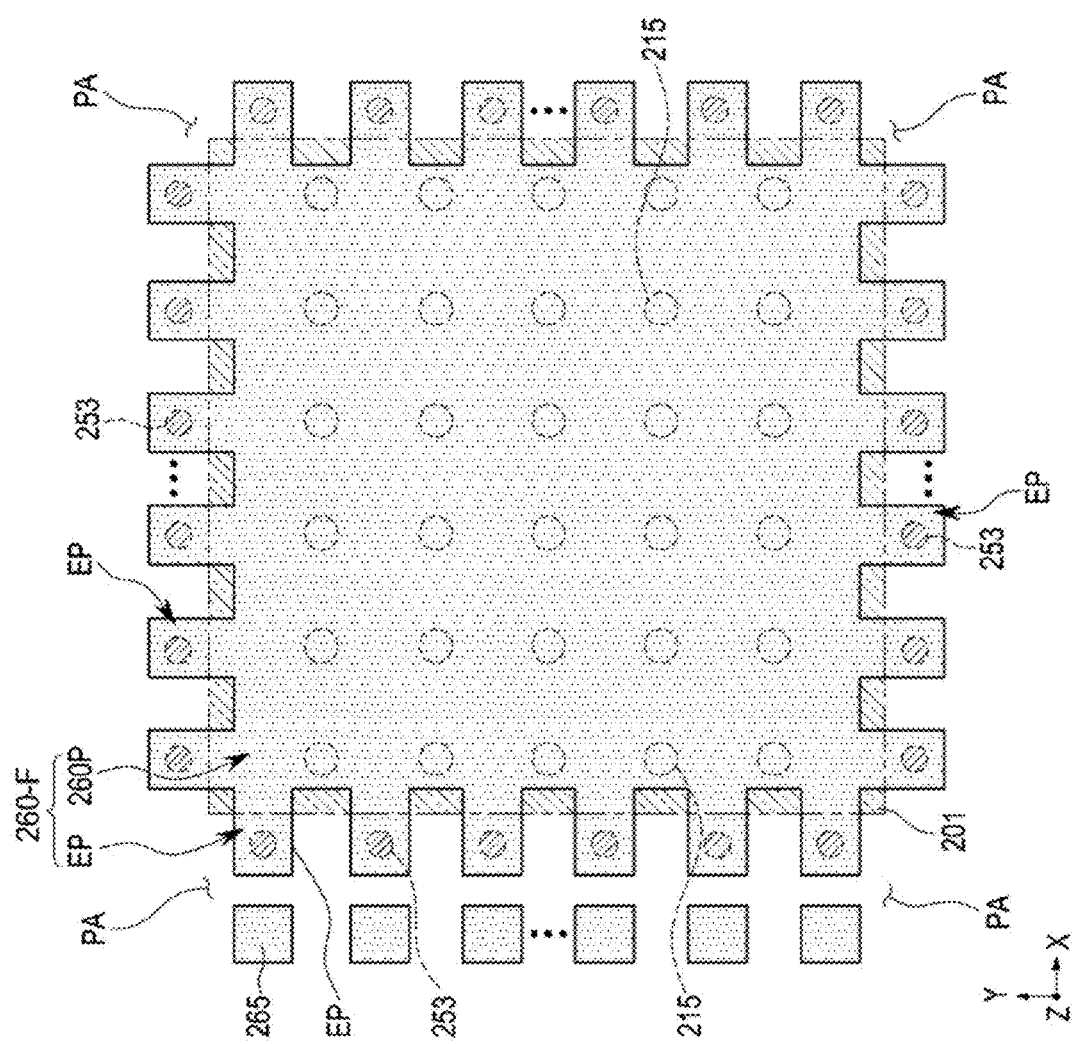

Referring to FIG. 8F, a source connection pattern 260-F may include a plate portion 260P and a plurality of extension portions EP extending from the plate portion 260P to an external region PA. The plate portion 260P may be disposed on the second substrate 201 and may be directly connected to the via patterns 215.

Figure 9:
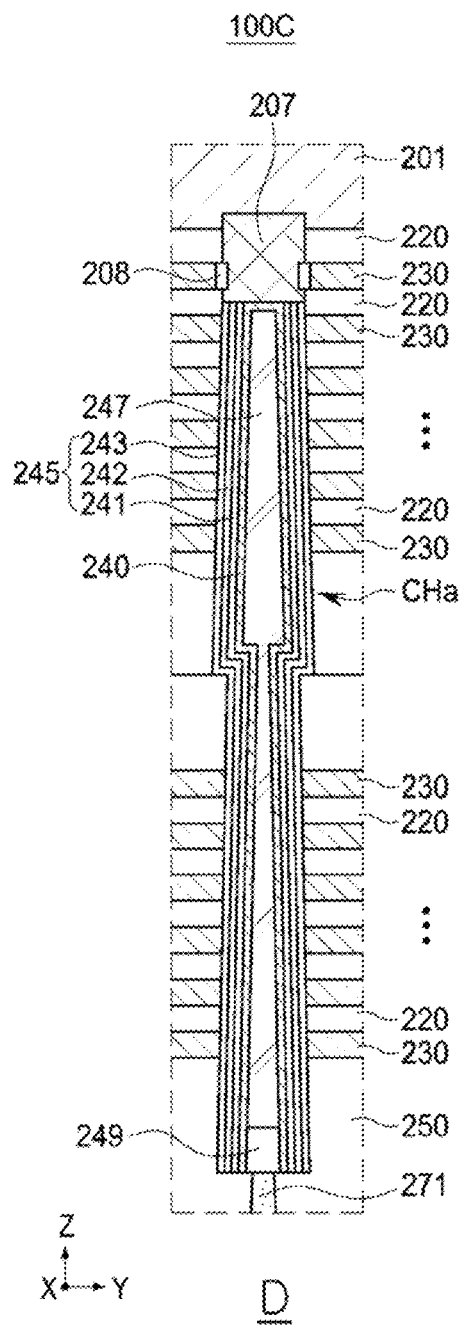
FIG. 9 is a partially enlarged cross-sectional view of a semiconductor device according to some example embodiments.

FIG. 9 is a partially enlarged cross-sectional view of a semiconductor device according to some example embodiments. FIG. 9 is an enlarged view of a region corresponding to region "D" of FIG. 2.

Referring to FIG. 9, in a semiconductor device 100C, a memory cell region CELL may not include first and second horizontal conductive layers 202 and 204 below a second substrate 201, unlike the example embodiment of FIG. 2. In addition, a channel structure CHa may further include an epitaxial layer 207.

An epitaxial layer 207 may be disposed to be in contact with the second substrate 201 on an upper end of the channel structure CHa, and may be disposed on a side surface of at least one gate electrode 230. The epitaxial layer 207 may be disposed in a recess region of the second substrate 201. A height of a lower surface of the epitaxial layer 207 may be smaller than a height of a lower surface of an uppermost gate electrode 230 and greater than a height of an upper surface of the lower gate electrode 230, but example embodiments are not limited thereto. The epitaxial layer 207 may be connected to the channel layer 240 through a lower surface thereof. A gate insulating layer 208 may be further disposed between the epitaxial layer 207 and a gate electrode 230 adjacent to the epitaxial layer 207.

FIGS. 10, 11, 12, 13, 14, 15, and 16 are schematic cross-sectional views illustrating a method of fabricating a semiconductor device according to some example embodiments.

In FIGS. 10, 11, 12, 13, 14, 15, and 16, regions corresponding to the region illustrated in FIG. 2 are illustrated.

Figure 10:
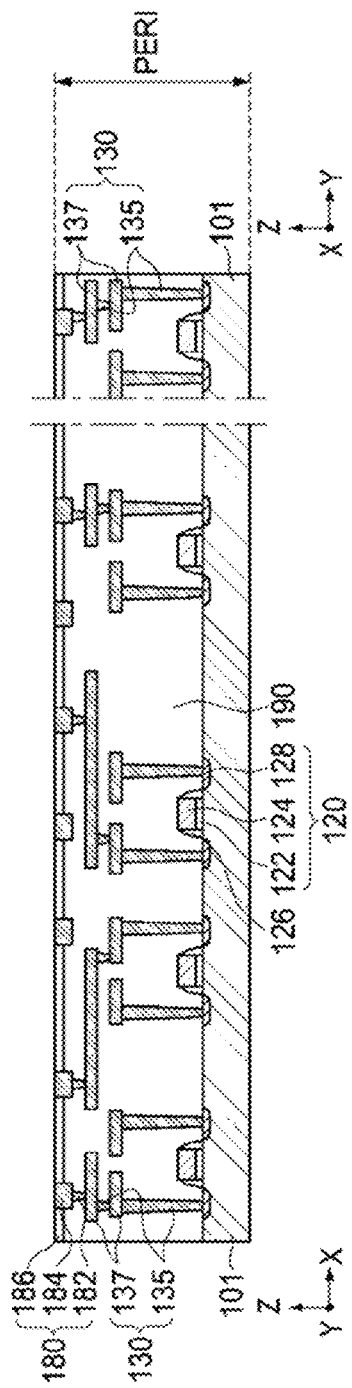
FIGS. 10, 11, 12, 13, 14, 15, and 16 are schematic cross-sectional views illustrating a method of fabricating a semiconductor device according to some example embodiments.

Referring to FIG. 10, a circuit device 120, a lower interconnection structure 130, a lower bonding structure 180, and a lower capping layer 190 may be formed on a first substrate 101 to constitute a peripheral circuit region PERI.

Device isolation layers may be formed in the first substrate 101, and a circuit gate dielectric layer 122 and a circuit gate electrode 124 may be sequentially formed on the first substrate 101. The device isolation layers may be formed by, for example, a shallow trench isolation (STI) process. The circuit gate dielectric layer 122 may be formed on the first substrate 101, and the circuit gate electrode 124 may be formed on the circuit gate dielectric layer 122. Then, spacer layers 126 may be formed on opposite sidewalls of the circuit gate dielectric layer 122 and the circuit gate electrode 124, and impurity may be implanted into an active region of the first substrate 101 on opposite sided adjacent to the circuit gate electrode 124 to form source/drain regions 128.

In a lower interconnection structure 130, lower contact plugs 135 may be formed by forming a portion of a lower capping layer 190, etching the portion of the lower capping layer 190 to be removed, and filling the removed portion with a conductive material. The lower interconnection lines 137 may be formed by, for example, depositing a conductive material and patterning the deposited conductive material.

In the lower bonding structure 180, a lower bonding via may be formed by forming a portion of the lower capping layer 190, etching the portion of the lower capping layer to be removed, and filling the removed portion with a conductive material. A lower bonding pad 184 may be formed by, for example, depositing a conductive material and patterning the deposited conductive material. The lower bonding structure 180 may be formed by, for example, a deposition process or a plating process. The lower bonding insulating layer 186 may be formed to cover a portion of an upper surface and side surfaces of the lower bonding pad 184, and may then be formed by performing a planarization process until an upper surface of the lower bonding pad 184 is exposed.

The lower capping layer 190 may include a plurality of insulating layers. The lower capping layer 190 may be a portion in each operation of forming the lower interconnection structure 130 and the lower bonding structure 180. Accordingly, a peripheral circuit region PERI may be formed.

Figure 11:
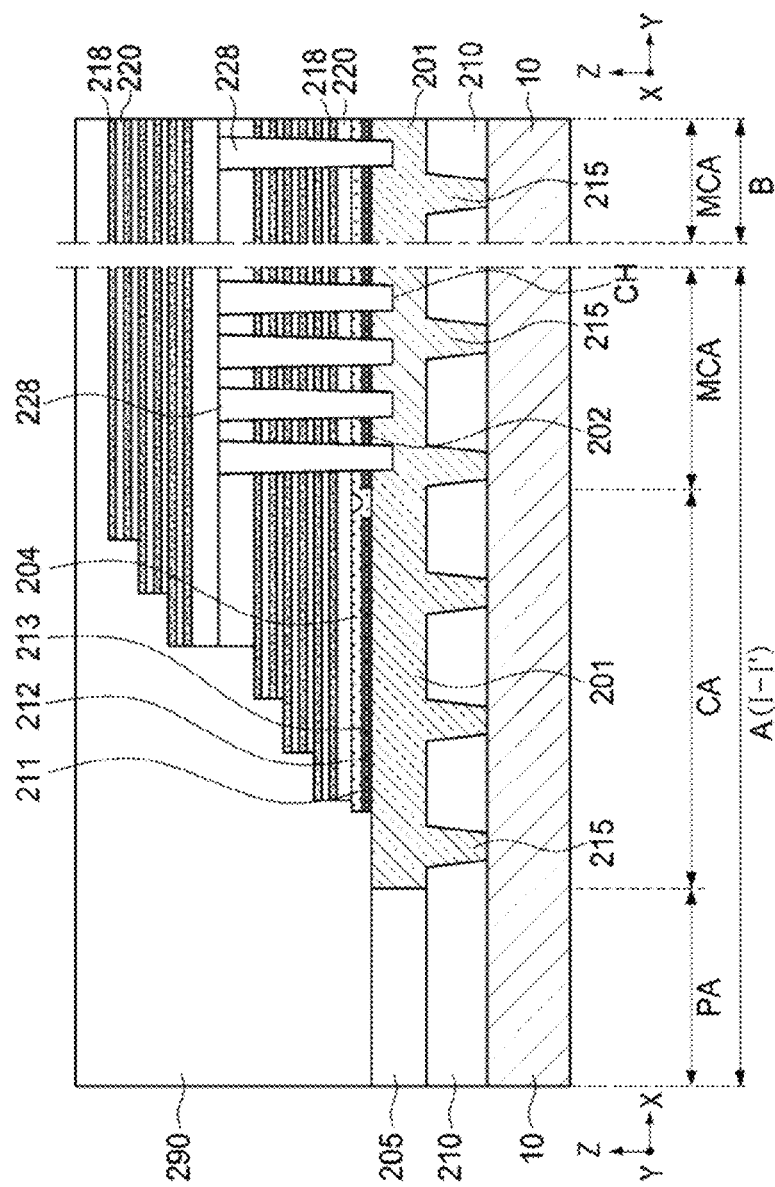

Referring to FIG. 11, via patterns 215 may be formed on the base substrate 10, and a second substrate 201 may be formed. First to third horizontal sacrificial layers 211, 212, and 213 and a second horizontal conductive layer 204 may be formed on the second substrate 201. Sacrificial insulating layers 218 and interlayer insulating layers 220 may be alternately stacked to form a lower stack structure, a vertical sacrificial structure 228 may be formed to penetrate through the lower stack structure, and the sacrificial insulating layers 218 and the interlayer insulating layers 220 may be alternately stacked to form an upper stack structure.

A first upper insulating layer 210 may be formed on a base substrate 10, and via patterns 215 may be formed to penetrate through the first upper insulating layer 210. The base substrate 10 may include a semiconductor material, for example, a group IV semiconductor, a group III-V compound semiconductor, or a group II-VI compound semiconductor. The base substrate 10 may be provided to control a thickness of the second substrate 201 in a process of removing the base substrate 10. The via patterns 215 may be formed by forming via holes to penetrate through a portion of the first upper insulating layer 210 and filling the via holes with a semiconductor material.

The second substrate 201 may be formed to be integrated with the via patterns 215 in the process of the via patterns 215, or may be formed separately from the via patterns 215. For example, via patterns 215 may be formed while filing the via holes with a semiconductor material layer, and the semiconductor material layer may extend upwardly of the via holes and an upper surface of the first upper insulating layer 210 to form a second substrate 201. A portion of the second substrate 201 may be removed in an external region PA. An external insulating layer 205 may be formed in a region in which the second substrate 201 is removed in the external region PA. In some example embodiments, the semiconductor device 100B of FIG. 7 may be fabricated by filling the via-holes with a metal material, performing a planarization process, forming the second substrate 201, and performing subsequent processes.

First to third horizontal sacrificial layers 211, 212, and 213 and a second horizontal conductive layer 204 may be formed on the second substrate 201. The second substrate 201 may be formed to be spaced apart from the base substrate 10 by the first upper insulating layer 210. The first to third horizontal sacrificial layers 211, 212, and 213 may be sequentially stacked on the second substrate 201. The first to third horizontal sacrificial layers 211, 212, and 213 may be replaced with the first horizontal conductive layer 202 of FIG. 2, formed through a subsequent process, in the memory cell array region MCA. The second horizontal conductive layer 204 may be formed on the third horizontal sacrificial layer 213.

A portion of the sacrificial insulating layers 218 may be replaced with gate electrodes 230 (see FIG. 2) through a subsequent process. The sacrificial insulating layers 218 may be formed of a material different from that of the interlayer insulating layers 220, and may be formed of a material etched with etching selectivity with respect to the interlayer insulating layers 220 under specific etching conditions. For example, the interlayer insulating layer 220 may be formed of at least one of silicon oxide or silicon nitride, and the sacrificial insulating layers 218 may be formed of a material different from a material of the interlayer insulating layer 220 selected from silicon, silicon oxide, silicon carbide, and silicon nitride. In some example embodiments, thicknesses of the interlayer insulating layers 220 may not all be the same. The thicknesses of the interlayer insulating layers 220 and the sacrificial insulating layers 218 and the number of layers constituting the interlayer insulating layers 220 and the sacrificial insulating layers 218 may be variously modified from those illustrated in the drawings.

A photolithography process and an etching process may be repeatedly performed on the sacrificial insulating layers 218 using a mask layer such that overlying sacrificial insulating layers 218 extend by a distance shorter than the underlying sacrificial insulating layers 218 in a connection region CA. Accordingly, the sacrificial insulating layers 218 may form a staircase-shaped step structure in a predetermined unit.

Forming a vertical sacrificial structure 228 may include anisotropically etching the lower stack structure of the sacrificial insulating layers 218 and the interlayer insulating layers 220 using a mask layer to form lower channel holes having a hole-shape and filling the lower channel holes with a sacrificial material. The vertical sacrificial structure 228 may include a semiconductor material such as polycrystalline silicon. In some example embodiments, the vertical sacrificial structure 228 may include at least one of silicon oxide, silicon nitride, or silicon oxynitride. After the vertical sacrificial structure 228 is formed, an upper stack structure including the sacrificial insulating layers 218 and the interlayer insulating layers 220 may be formed on the lower stack structure and the vertical sacrificial structure 228.

A portion of an upper capping layer 290 may be formed to cover the stack structure of the sacrificial insulating layers 218 and the interlayer insulating layers 220.

Figure 12:
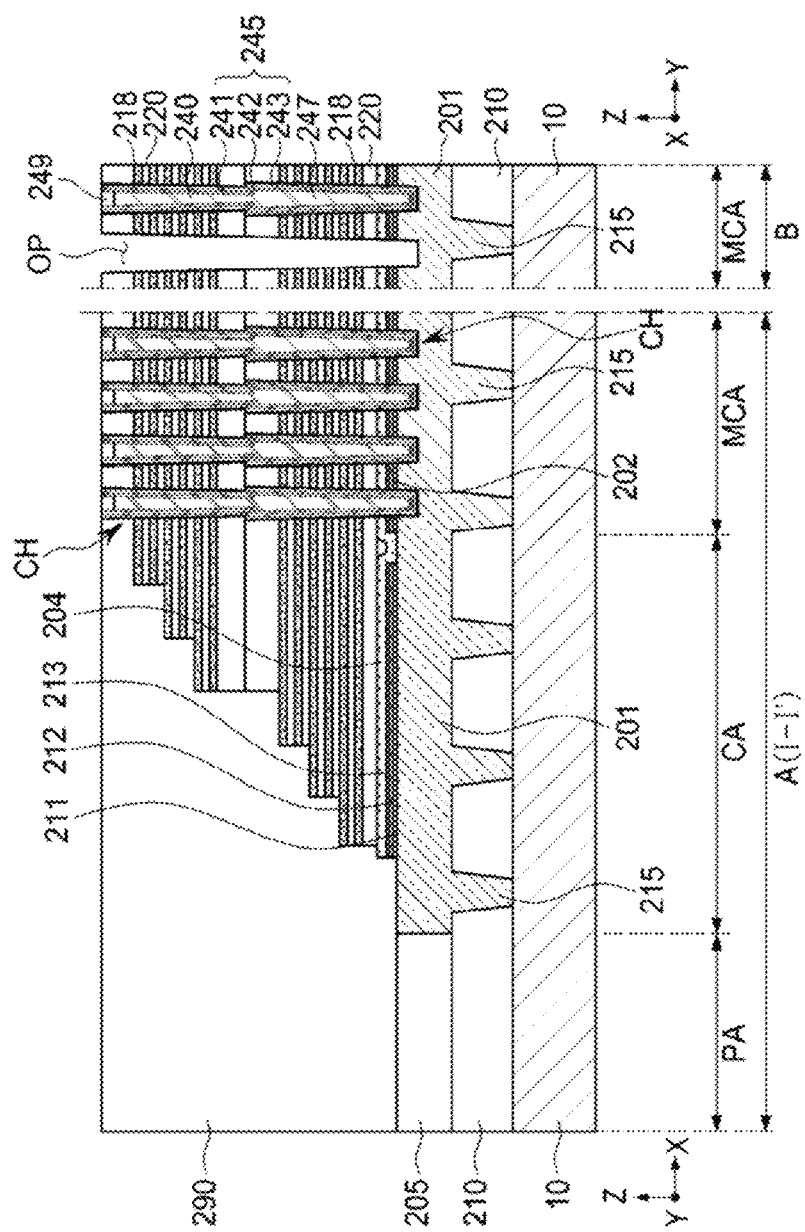

Referring to FIG. 12, channel structures CH may be formed to penetrate through the stack structure of the sacrificial insulating layers 218 and the interlayer insulating layers 220. In a region corresponding to the separation region MS (see FIG. 2), an opening may be formed to penetrate through the stack structure of the sacrificial insulating layers 218 and the interlayer insulating layers 220.

The channel structures CH may be formed by filling hole-shaped channel holes with a plurality of layers. The plurality of layers may include a gate dielectric layer 245, a channel layer 240, a core insulating layer 247, and a channel pad 249. Upper channel holes of the channel holes may be formed by anisotropically etching the upper stack structure of the sacrificial insulating layers 218 and the interlayer insulating layers 220 using an additional mask layer. Lower channel holes of the channel holes may be formed by removing the vertical sacrificial structure 228 exposed through the upper channel holes. When the channel holes are formed by a plasma dry etching process, a potential difference may occur in upper and lower portions of the channel holes due to ions generated in the channel holes. However, since the second horizontal conductive layer 204 and the second substrate 201 are connected to the base substrate 10 by the via patterns 215, for example, positive charges may flow to the base substrate 10 and negative charges moving through the mask layer may flow to the base substrate 10, and thus, arcing fault caused by the potential difference may be prevented from occurring.

Due to a height of the stack structure, sidewalls of the channel structures CH may not be perpendicular to the upper surface of the second substrate 201. The channel structures CH may be formed to recess a portion of the second substrate 201.

A gate dielectric layer 245 may be formed to have a uniform thickness. In the present operation, the entire or a portion of the gate dielectric layer 245 may be formed, and a portion extending in a direction, perpendicular to the second substrate 201, along the channel structures CH may be formed. A channel layer 240 may be formed on the gate dielectric layer 245 in the channel structures CH. The core insulating layer 247 may be formed to fill the channel structures CH, and may include an insulating material. The channel pad 249 may be formed of a conductive material, for example, polycrystalline silicon.

An opening OP may be performed to penetrate through the stack structure of the sacrificial insulating layers 218 and the interlayer insulating layers 220 and to penetrate through the second horizontal conductive layer 204 and the first to third horizontal sacrificial layers 211, 212, and 213 in a lower portion thereof. The opening OP may be formed to recess a portion of the second substrate 201.

Figure 13:
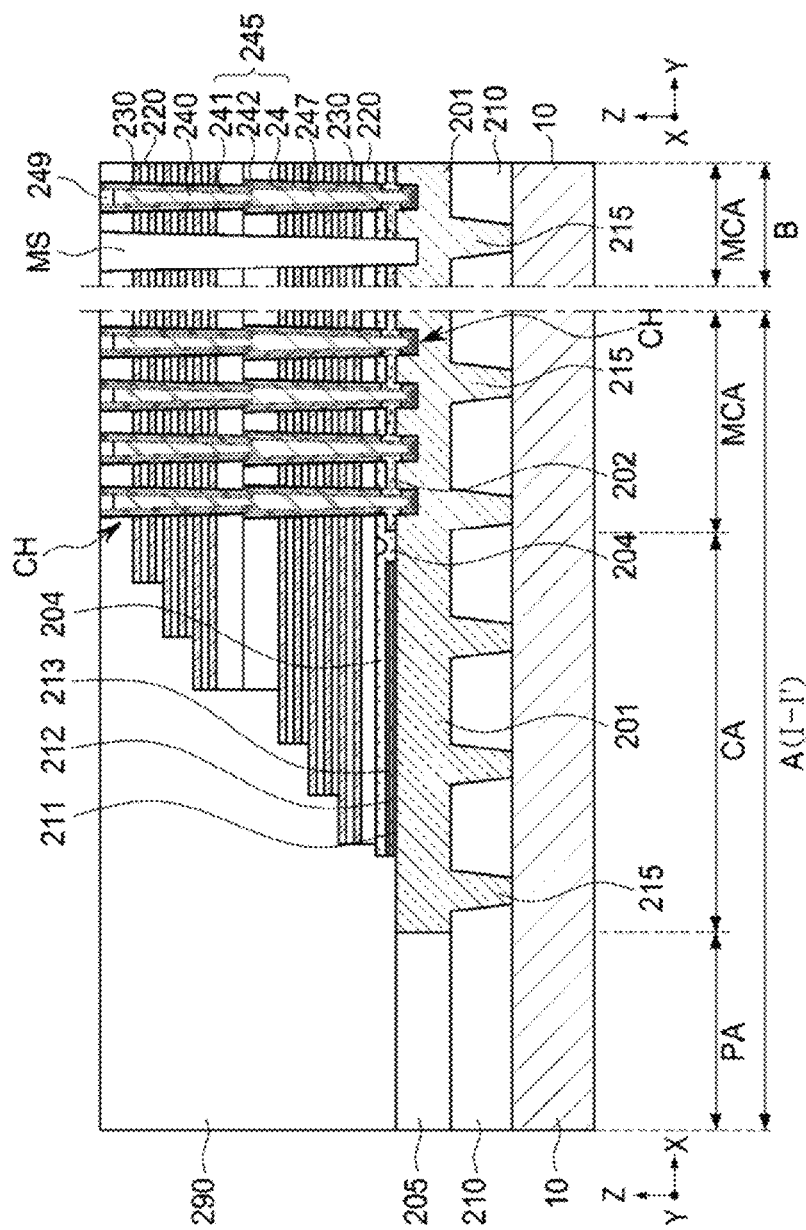

Referring to FIG. 13, the sacrificial insulating layers 218 may be removed through the opening OP to form gate electrodes 230. A separation region MS may be formed in the opening OP.

The second horizontal sacrificial layer 212 may be exposed by an etch-back process while forming separate sacrificial spacer layers in the opening OP. The second horizontal sacrificial layer 212 may be selectively removed from the exposed region in the memory cell array region MCA, and the upper and lower first and third horizontal sacrificial layers 211 and 213 may then be removed.

The first to third horizontal sacrificial layers 211, 212, and 213 may be removed by an etching process. A portion of the gate dielectric layer 245, exposed in the region in which the second horizontal sacrificial layer 212 is removed, may also be removed in the process of removing the first and third horizontal sacrificial layers 211 and 213. A conductive material may be deposited in the region, in which the first to third horizontal sacrificial layers 211, 212, and 213 are removed, to form a first horizontal conductive layer 202, and the sacrificial spacer layers may then be removed in the opening O. By the present process, the first horizontal conductive layer 202 may be formed in the memory cell array region MCA and the first to third horizontal sacrificial layers 211, 212, and 213 may remain in the connection region CA.

The sacrificial insulating layers 218 may be removed through the opening OP to form tunnel portions, and the tunnel portions may be filled with a conductive material to form gate electrodes 230. The conductive material may include a metal, polycrystalline silicon, or a metal silicide material. After the gate electrodes 230 are formed, the conductive material deposited in the opening OP may be removed through an additional process and an insulating material may then fill the opening OP to from a separation region MS.

Figure 14:
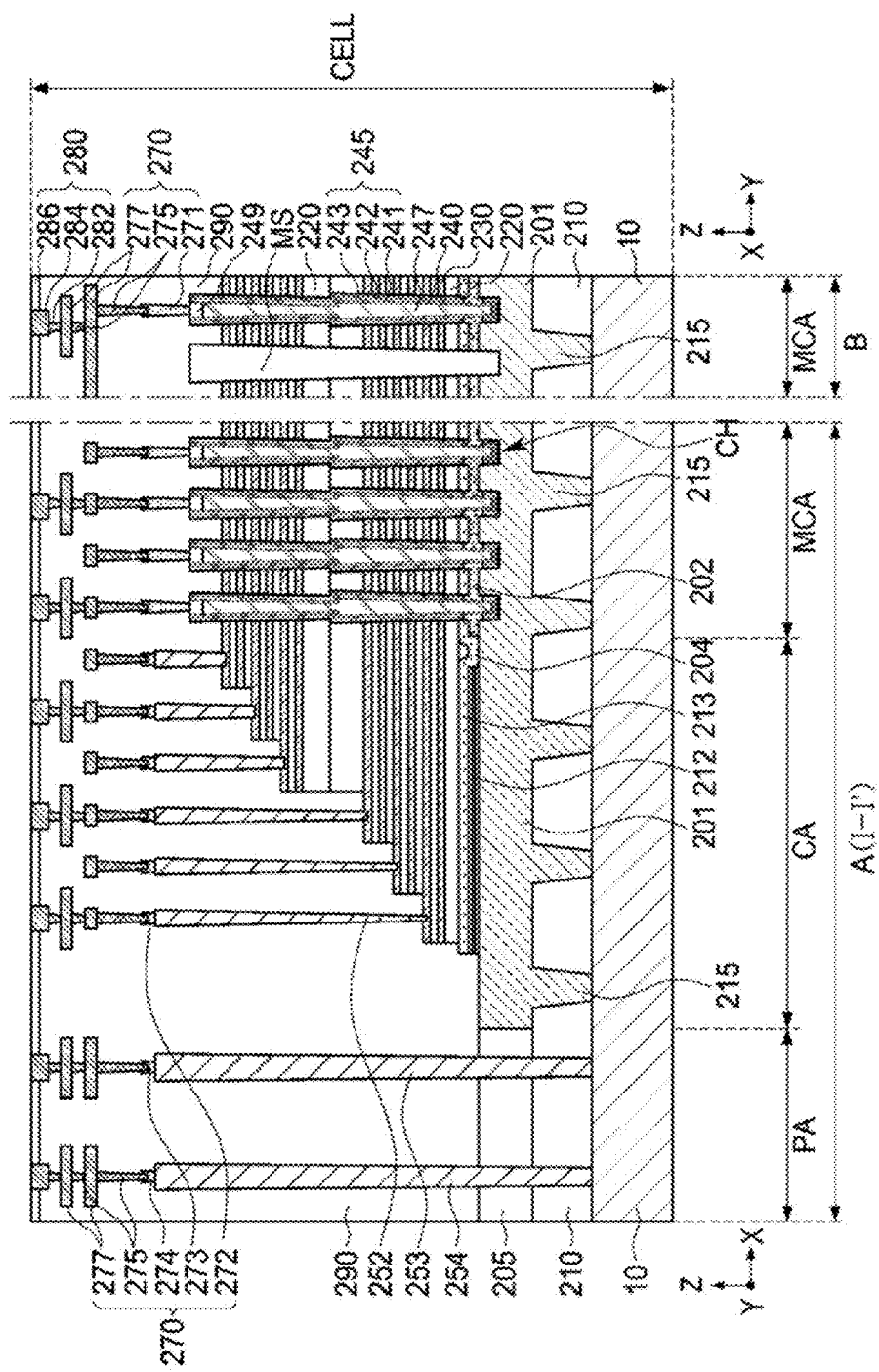

Referring to FIG. 14, an upper interconnection structure 270 including gate contact plugs 252, source contact plugs 253, peripheral contact plugs 254, and channel contact plugs 271 may be formed, and an upper bonding structure 280 may be formed.

The gate contact plugs 252 may be formed to be connected to the gate electrodes 230 in the connection region CA, and the source contact plugs 253 and the peripheral contact plugs 254 may be formed to be connected to the base substrate 10 in the external region PA. The channel contact plugs 271 may be formed to be connected to the channel structures CH in the memory cell array region MCA. The gate contact plugs 252, the source contact plugs 253, and the peripheral contact plugs 254 may be formed to have different depths, but may be formed by simultaneously forming contact holes using an etch-stop layer, or the like, and filling the contact holes with a conductive material. Alternatively, in some example embodiments, some of the gate contact plugs 252, the source contact plugs 253, and the peripheral contact plugs 254 may be formed in different processes.

The contact studs 272, 273, and 274 may be formed to be connected to the gate contact plugs 252, the source contact plugs 253, and the peripheral contact plugs 254, respectively. The upper contact plugs 275 may be formed on the contact studs 272, 273, and 274, and the upper interconnection lines 277 may be vertically connected to each other.

An upper bonding structure 280 may be formed in a manner similar to the manner of forming the lower bonding structure 180. Accordingly, a memory cell region CELL may be formed. However, in the process of fabricating the semiconductor device, the memory cell region CELL may be in the state of further including the base substrate 10.

Figure 15:
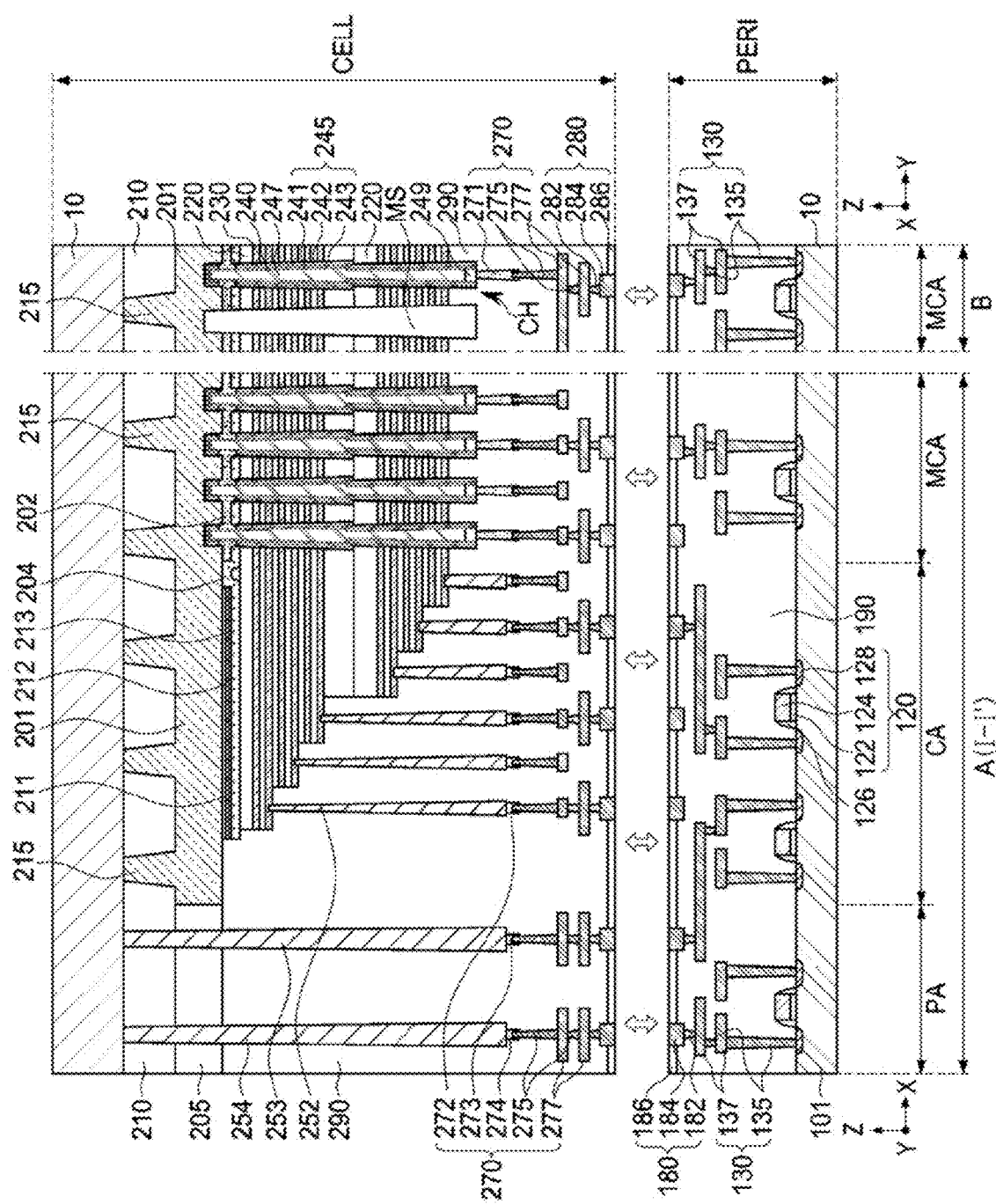

Referring to FIG. 15, the peripheral circuit region PERI, a first substrate structure, and the memory cell region CELL, a second substrate structure, may be bonded to each other.

The peripheral circuit region PERI and the memory cell region CELL may be connected by pressing and bonding the lower bonding pad 184 and the upper bonding pad 284. The lower bonding insulating layer 186 and the upper bonding insulating layer 286 may be pressed and bonded to be connected to each other. By turning over the memory cell region CELL on the peripheral circuit region PERI, the upper bonding pads 284 may be bonded downwardly. The peripheral circuit region PERI and the memory cell region CELL may be directly bonded without an adhesive, such as an additional adhesive layer, interposed therebetween.

Figure 16:
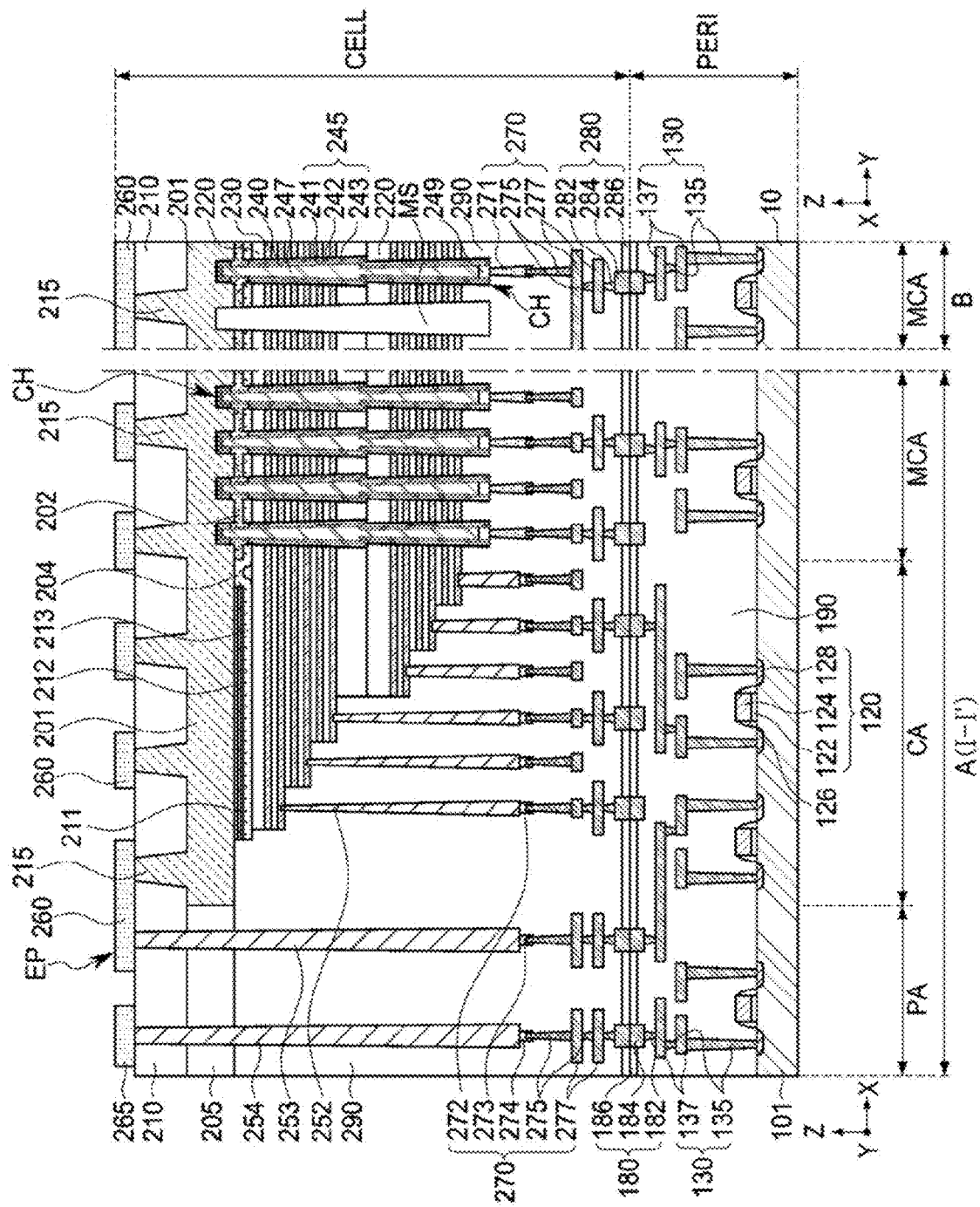

Referring to FIG. 16, the base substrate 10 may be removed, and a source connection pattern 260 and a peripheral contact pad 265 may be formed.

The base substrate 10 may be removed by, for example, a polishing process such as a grinding process or a chemical mechanical polishing (CMP) process. The base substrate 10 may be completely removed to expose a surface of the via patterns 215. Surfaces of the source contact plug 253 and the peripheral contact plug 254 may also be exposed.

A metal layer may be formed on the first upper insulating layer 210. The metal layer may be patterned to form a source connection pattern 260 and a peripheral contact pad 265. The source connection pattern 260 may include the extension portion EP in the external region PA to be directly connected to the source contact plug 253, and may be directly connected to each of the via patterns 215. The source connection pattern 260 may be formed to have various shapes as illustrated in FIGS. 3, 6, and 8A to 8F. For example, the source connection pattern 260 may include at least one region having a grid shape or a line shape in a plan view. The peripheral contact pad 265 may be formed to be spaced apart from the source connection pattern 260. In some example embodiments, the source connection pattern 260 and the peripheral contact pads 265 may be formed by patterning an insulating layer and filling the insulating layer with a conductive material.

A portion of the second upper insulating layer 295 may be formed, and a peripheral contact via 267 and a conductive pad 300 may be formed. The peripheral contact via 267 may be formed by forming a via hole to penetrate through a portion of the second upper insulating layer 295 and filling the via hole with a conductive material. The conductive pad 300 may also be formed by removing a portion of the second upper insulating layer 295 and filling the removed portion with a conductive material. As a result, the semiconductor device of FIGS. 1 to 4B may be fabricated.

Figure 17:
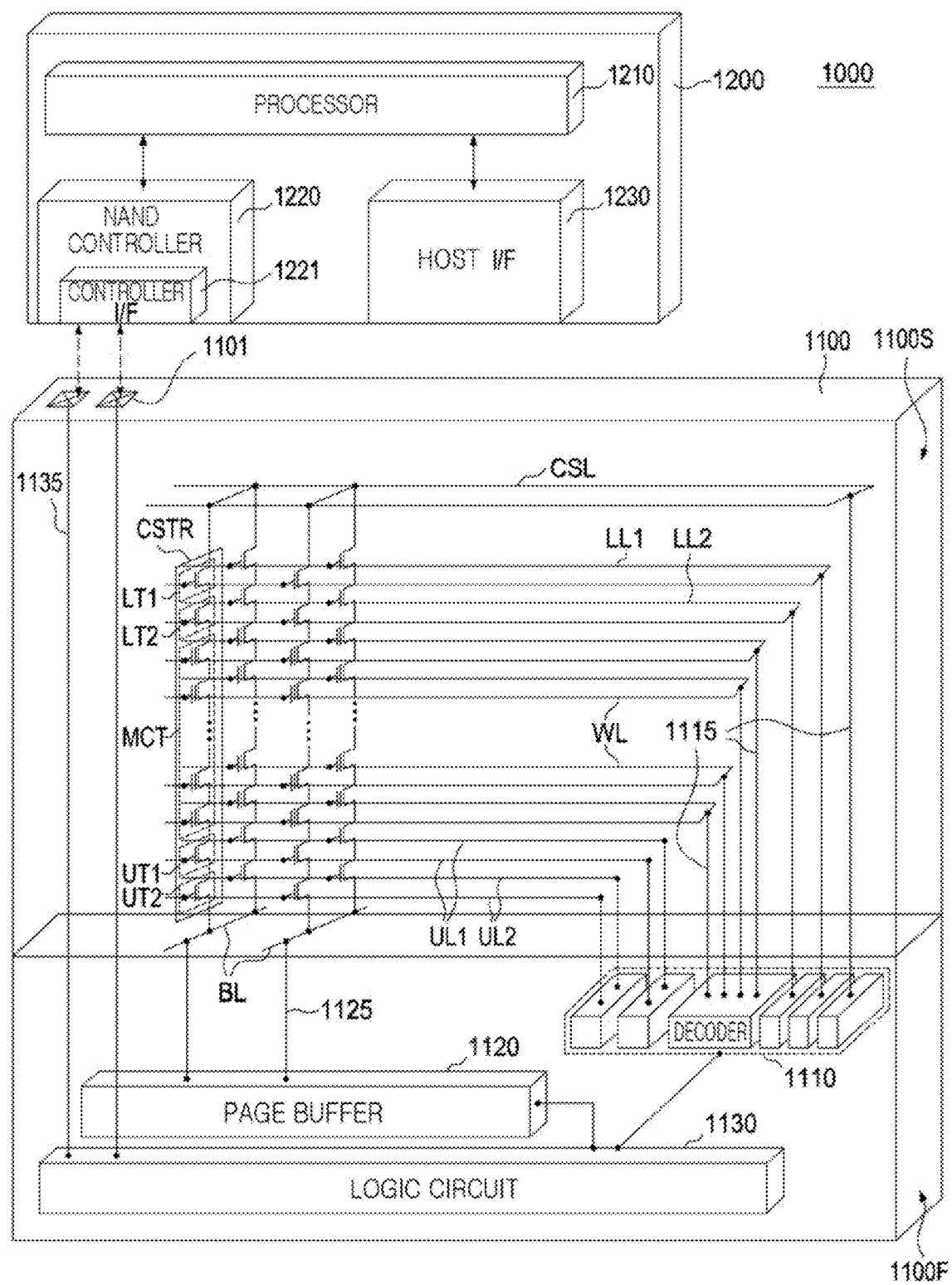
FIG. 17 is a schematic diagram of a data storage system including a semiconductor device according to some example embodiments.

FIG. 17 is a schematic diagram of a data storage system including a semiconductor device according to some example embodiments.

Referring to FIG. 17, a data storage system 1000 may include a semiconductor device 1100 and a controller 1200 electrically connected to the semiconductor device 1100. The data storage system 1000 may be implemented by a storage device including one or more semiconductor devices 1100 or an electronic device including the storage device. For example, the data storage system 1000 may be implemented by a solid-state drive device (SSD) including one or more semiconductor devices 1100, a universal serial bus (USB), a computing system, a medical device, or a communications device.

The semiconductor device 1100, also referred to herein as a semiconductor storage device, may include any of the semiconductor devices according to any of the example embodiments. The semiconductor device 1100 may be implemented as a nonvolatile memory device, and may be implemented as, for example, the NAND flash memory device described in the example embodiment described above with reference to FIGS. 1 to 8. The semiconductor device 1100 may include a first semiconductor structure 1100F and a second semiconductor structure 1100S on the first semiconductor structure 1100F. In some example embodiments, the first semiconductor structure 1100F may be disposed alongside the second semiconductor structure 1100S. The first semiconductor structure 1100F may be implemented as a peripheral circuit structure including a decoder circuit 1110, a page buffer 1120, and a logic circuit 1130. The second semiconductor structure 1100S may be implemented as a memory cell structure including a bitline BL, common source line CSL, wordlines WL, first and second gate upper lines UL1 and UL2, first and second gate lower lines LL1 and LL2, and memory cell strings CSTR between the bitline BL and the common source line CSL.

In the second semiconductor structure 1100S, each of the memory cell strings CSTR may include lower transistors LT1 and LT2 adjacent to the common source line CSL, upper transistors UT1 and UT2 adjacent to the bitline BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may vary according to some example embodiments.

In some example embodiments, the upper transistors UT1 and UT2 may include a string select transistor, and the lower transistors LT1 and LT2 may include a ground select transistor. The lower gate lines LL1 and LL2 may be configured as gate electrodes of the lower transistors LT1 and LT2, respectively. The wordlines WL may be configured as gate electrodes of the memory cell transistors MCT, and the upper gate lines UL1 and UL2 may be configured as gate electrodes of the upper transistors UT1 and UT2, respectively.

In some example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 or the upper erase control transistor UT1 may be used for an erase operation of erasing data stored in the memory cell transistors MCT based on GIDL.

The common source line CSL, the first and second gate lower lines LL1 and LL2, the wordlines WL, and the first and second gate upper lines UL1 and UL2 may be electrically connected to the decoder circuit 1110 through first connection lines 1115 extending from the first semiconductor structure 1100F to the second semiconductor structure 1100S. The bitlines BL may be electrically connected to the page buffer 1120 through second connection lines 1125 extending from the first semiconductor structure 1100F to the second semiconductor structure 1100S.

In the first semiconductor structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input and output pad 1101 may be electrically connected to the logic circuit 1130 through an input/output connection line 1135 extending from the first semiconductor structure 1100F to the second semiconductor structure 1100S. The input/output pad 1101 may be a conductive pad 300 according to any of the example embodiments of semiconductor devices and/or may be electrically connected to elements of a semiconductor device according to any of the example embodiments that may be included any of the semiconductor devices 1100.

The controller 1200 may include a processor 1210, a NAND controller 1220, and a host interface 1230. In some example embodiments, the data storage system 1000 may include a plurality of semiconductor devices 1100. In this case, the controller 1200 may control the plurality of semiconductor devices 1100. The controller 1200 may be electrically connected to the semiconductor devices 1100 through the input/output pad 1101. Thus, the controller 1200 may be electrically connected to a semiconductor device, semiconductor storage device, or the like that may be included in and/or at least partially comprise the semiconductor device 1100, through the input/output pad 1101. The controller 1200 may be configured to control the semiconductor device 1100 (e.g., via communication with the semiconductor device 1100 through the input/output pad 1101).

The processor 1210 may control overall operations of the data storage system 1000 including the controller 1200. The processor 1210 may operate according to a predetermined firmware, and may access the semiconductor device 1100 by controlling the NAND controller 1220. The NAND controller 1220 may include a NAND interface 1221 for processing communication with the semiconductor device 1100. Through the NAND interface 1221, a control command for controlling the semiconductor device 1100, data to be written in the memory cell transistors MCT of the semiconductor device 1100, and data to be read from the memory cell transistors MCT may be transmitted. The host interface 1230 may provide a communication function between the data storage system 1000 and an external host. When a control command is received from an external host through the host interface 1230, the processor 1210 may control the semiconductor device 1100 in response to the control command.

Figure 18:
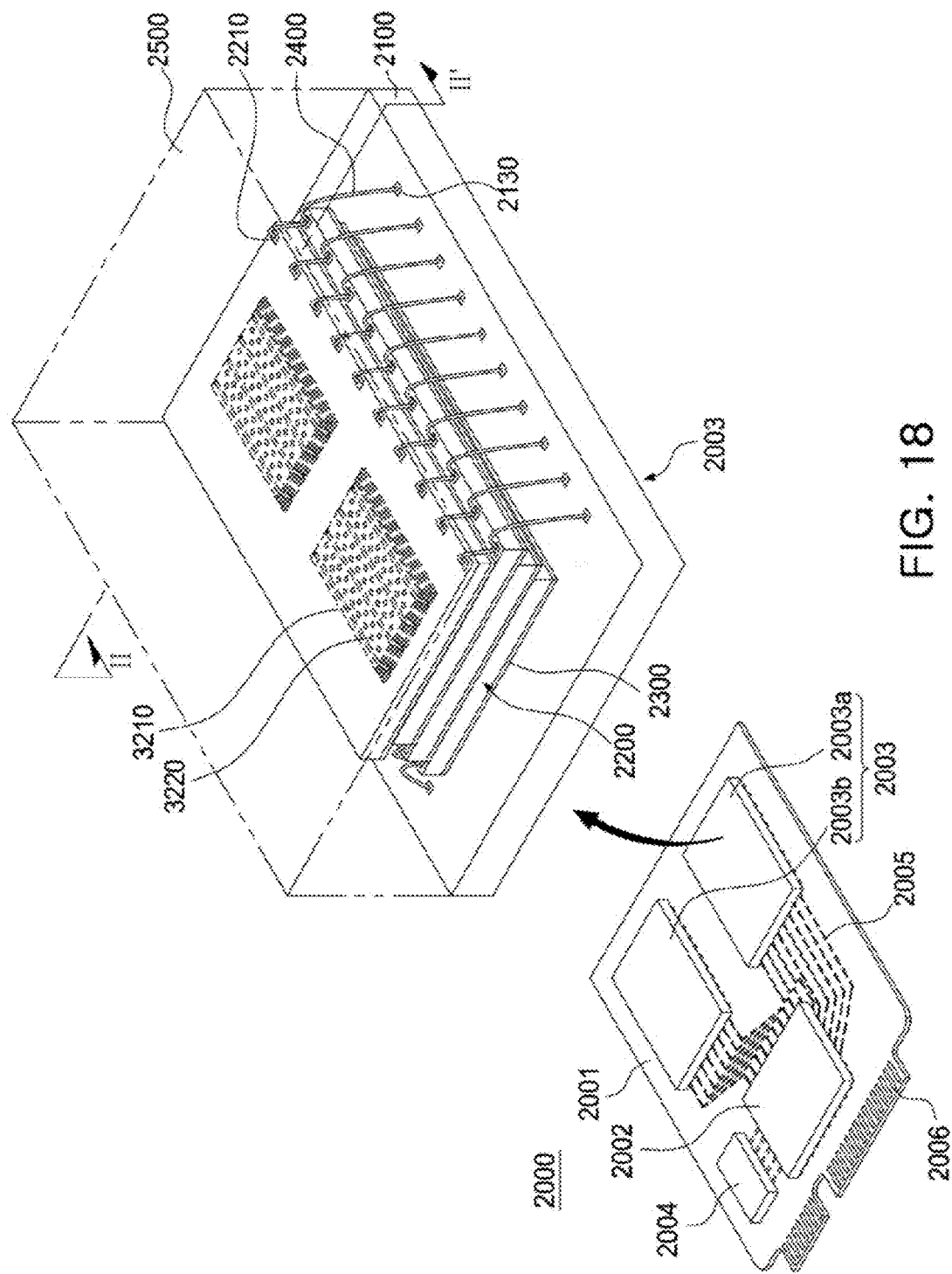
FIG. 18 is a schematic perspective view of a data storage system including a semiconductor device according to some example embodiments.

FIG. 18 is a schematic perspective view of a data storage system including a semiconductor device according to some example embodiments.

Referring to FIG. 18, a data storage system 2000 in some example embodiments may include a main substrate 2001, a controller 2002 mounted on the main substrate 2001, one or more semiconductor packages 2003, and a DRAM 2004. The semiconductor package 2003 and the DRAM 2004 may be connected to the controller 2002 by interconnection patterns 2005 formed on the main substrate 2001.

The main substrate 2001 may include a connector 2006 including a plurality of pins coupled to an external host. The number and the arrangement of the plurality of pins in the connector 2006 may vary depending on a communication interface between the data storage system 2000 and an external host. In some example embodiments, the data storage system 2000 may communicate with an external host according to one of interfaces such as universal serial bus (USB), peripheral component interconnect express (PCI-Express), serial advanced technology attachment (SATA), M-PHY for universal flash storage (UFS), and the like. In some example embodiments, the data storage system 2000 may be operated by power supplied from an external host through the connector 2006. The data storage system 2000 may further include a power management integrated circuit (PMIC) for distributing power supplied from the external host to the controller 2002 and the semiconductor package 2003.

The controller 2002 may write data in the semiconductor package 2003 or may read data from the semiconductor package 2003, and may improve an operation speed of the data storage system 2000.

The DRAM 2004 may be implemented as a buffer memory for mitigating a difference in speeds between the semiconductor package 2003, a data storage space, and an external host. The DRAM 2004 included in the data storage system 2000 may also operate as a cache memory, and may provide a space for temporarily storing data in a control operation for the semiconductor package 2003. When the DRAM 2004 is included in the data storage system 2000, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the first and second semiconductor packages 2003a and 2003b may include a package substrate 2100, semiconductor chips 2200 on the package substrate 2100, and adhesive layers 2300 disposed on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be configured as a printed circuit board including the package upper pads 2130. Each semiconductor chip 2200 may include an input/output pad 2210. The input/output pad 2210 may correspond to the input/output pad 1101 in FIG. 16 and may include the conductive pad 300 in FIG. 2. Each of the semiconductor chips 2200 may include gate stack structures 3210 and channel structures 3220. Each of the semiconductor chips 2200 may include the semiconductor device described in the example embodiment described above with reference to FIGS. 1 to 9.

In some example embodiments, the connection structure 2400 may be configured as a bonding wire electrically connecting the input/output pad 2210 to the package upper pads 2130. Accordingly, in each of the first and second semiconductor packages 2003a and 2003b, the semiconductor chips 2200 may be electrically connected to each other by a bonding wire method, and may be electrically connected to the package upper pads 2130 of the package substrate 2100. In some example embodiments, in each of the first and second semiconductor packages 2003a and 2003b, the semiconductor chips 2200 may be electrically connected to each other by a connection structure including a through-silicon via (TSV), rather than the connection structure 2400 of a bonding wire type.

In some example embodiments, the controller 2002 and the semiconductor chips 2200 may be included in a single package. In some example embodiments, the controller 2002 and the semiconductor chips 2200 may be mounted on an interposer substrate separate from the main substrate 2001, and the controller 2002 may be connected to the semiconductor chips 2200 by an interconnection formed on the interposer substrate.

Figure 19:
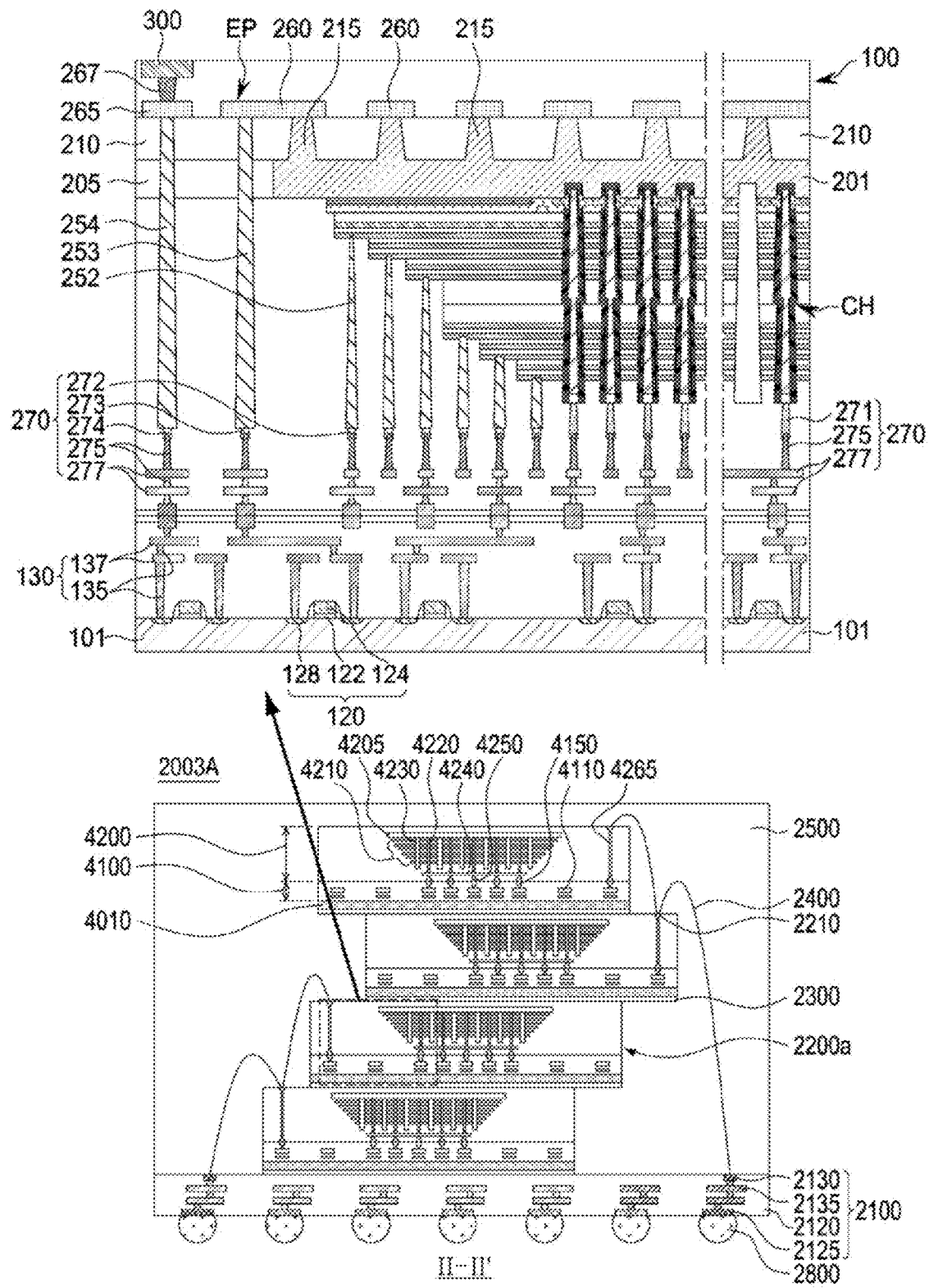
FIG. 19 is a schematic cross-sectional view of a semiconductor package according to some example embodiments.

FIG. 19 is a schematic cross-sectional view of a semiconductor package according to some example embodiments. FIG. 19 illustrates some example embodiments of the semiconductor package 2003 in FIG. 18, conceptually illustrating the semiconductor package 2003 in FIG. 18 taken along line IV-IV'.

Referring to FIG. 19, in a semiconductor package 2003, a package substrate 2100 may be configured as a printed circuit board. The package substrate 2100 may include a package substrate body portion 2120, package upper pads 2130 (see FIG. 19) disposed on the upper surface of the package substrate body portion 2120, lower pads 2125 disposed on or exposed through the lower surface of the package substrate body portion 2120, and internal interconnections 2135 electrically connecting the package upper pads 2130 to the lower pads 2125 in the package substrate body portion 2120. The package upper pads 2130 may be electrically connected to the connection structures 2400. The lower pads 2125 may be connected to the interconnection patterns 2005 of the main substrate 2001 of the data storage system 2000 as illustrated in FIG. 18 through conductive connection portions 2800.

Each of the semiconductor chips 2200 may include a semiconductor substrate 4010, and a first structure 4100 and a second structure 4200 stacked in order on the semiconductor substrate 4010. The first structure 4100 may include a peripheral circuit region including peripheral interconnections 4110, and first bonding structures 4150. The second structure 4200 may include a common source line 4205, a gate stack structure 4210 on the common source line 4205, memory channel structures 4220 and separation regions 4230 penetrating the gate stack structure 4210, bitlines 4240 electrically connected to the memory channel structures 4220 and second bonding structures 4250 electrically connected to the memory channel structures 4220 and wordlines (see FIG. 17) of the gate stack structure 4210. The first bonding structures and the second bonding structures may be bonded to be in contact with to each other. As described above with reference to FIGS. 1 to 9, in each of the semiconductor chips 2200, a source contact plug 253 may be directly connected to a source connection pattern 260, and the source connection pattern 260 may be disposed to be directly connected to via patterns 215 connected to an upper portion of a second substrate 201.

Each of the semiconductor chips 2200a may include an input/output pad 2210 and an input/output interconnection 4265 below the input/output pad 2210. The input/output interconnection 4265 may be electrically connected to some of the second bonding structures 4250. The input/output pad 2210 may be a region including a conductive pad 300.

As described above, a via pattern and a source connection pattern may be disposed on a substrate including a common source line, and a source contact plug may extend from an external side of the substrate in a vertical direction to be directly connected to the source connection pattern. Thus, a semiconductor device having improved electrical characteristics and reliability and a data storage system including the same may be provided.

As described herein, any devices, systems, modules, units, controllers, circuits, and/or portions thereof according to any of the example embodiments (including, without limitation, the data storage system 1000, semiconductor device 1100, controller 1200, decoder circuit 1110, page buffer 1120, logic circuit 1130, processor 1210, NAND controller 1220, data storage system 2000, controller 2002, semiconductor packages 2003, DRAM 2004, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, modules, units, controllers, circuits, and/or portions thereof according to any of the example embodiments, and/or any portions thereof.

While some example embodiments have been shown and described above, it will be apparent to those skilled in the art that modifications and variations could be made without departing from the scope of the present inventive concepts as defined by the appended claims.

What is claimed is:

1. A semiconductor device, comprising:
a first semiconductor structure including
 a first substrate,
 circuit devices on the first substrate,
 a lower interconnection structure electrically connected to the circuit devices, and
 a lower bonding structure connected to the lower interconnection structure; and
a second semiconductor structure including
 a second substrate on the first semiconductor structure,
 gate electrodes spaced apart from each other and stacked in a vertical direction that is perpendicular to a lower surface of the second substrate,
 channel structures penetrating through the gate electrodes, extending in the vertical direction, each of the channel structures including a channel layer,
 an upper interconnection structure below the gate electrodes and the channel structures, and
 an upper bonding structure connected to the upper interconnection structure and bonded to the lower bonding structure,
wherein the second semiconductor structure further includes
 via patterns on an upper surface of the second substrate, the upper surface of the second substrate opposite the lower surface of the second substrate, the lower surface of the second facing the first substrate,
 a source contact plug spaced apart from the second substrate, and
 a source connection pattern configured to be in contact with an upper surface of each of the via patterns and to electrically connect the via patterns and the source contact plug to each other,
wherein the source connection pattern includes
 an overlapping portion that overlaps the second substrate in the vertical direction, and
 an extension portion that extends from the overlapping portion in a horizontal direction that is parallel to the lower surface of the second substrate, and
wherein the source contact plug overlaps the extension portion of the source connection pattern in the vertical direction.

2. The semiconductor device of claim 1, wherein
an upper surface of the source contact plug is at a level higher than a level of the upper surface of the second substrate, based on an upper surface of the first substrate, and
the upper surface of the source contact plug is in contact with the extension portion of the source connection pattern.

3. The semiconductor device of claim 1, wherein an upper surface of the source contact plug is at a same level as an upper surface of at least one of the via patterns, based on an upper surface of the first substrate.

4. The semiconductor device of claim 1, wherein the source connection pattern includes at least one region having a grid shape or a line shape on the upper surface of the second substrate.

5. The semiconductor device of claim 1, wherein
the source connection pattern includes a barrier layer and a conductive layer on the barrier layer, and
the barrier layer is in contact with the via patterns and the source contact plug.

6. The semiconductor device of claim 1, wherein each of the via patterns has an upper portion and a lower portion, the lower portion having a width greater than a width of the upper portion.

7. The semiconductor device of claim 1, wherein the via patterns and the second substrate include a semiconductor material including impurities having a same conductivity type.

8. The semiconductor device of claim 1, wherein
the second substrate is formed of a semiconductor material, and
each of the via patterns is formed of a metal material.

9. The semiconductor device of claim 1, wherein the second semiconductor structure further includes a peripheral contact plug spaced apart from the source contact plug on an external side of the second substrate and extending in the vertical direction.

10. The semiconductor device of claim 9, wherein the second semiconductor structure further includes
a peripheral contact pad configured to be in contact with an upper surface of the peripheral contact plug and to be spaced apart from the source connection pattern,
a peripheral contact via on the peripheral contact pad, and
a conductive pad on the peripheral contact via.

11. The semiconductor device of claim 9, wherein an upper surface of the peripheral contact plug and an upper surface of the source contact plug are at a same level, based on an upper surface of the first substrate.

12. A semiconductor device, comprising:
a first substrate;
circuit devices on the first substrate;

a lower interconnection structure electrically connected to the circuit devices;

a lower bonding structure connected to the lower interconnection structure;

an upper bonding structure bonded to the lower bonding structure;

an upper interconnection structure connected to the upper bonding structure;

a second substrate on the upper interconnection structure;

gate electrodes between the upper interconnection structure and the second substrate, the gate electrodes spaced apart from each other;

channel structures penetrating through the gate electrodes, each of the channel structures including a channel layer;

via patterns on an upper surface of the second substrate, the upper surface of the second substrate opposite a lower surface of the second substrate, the lower surface of the second substrate facing the first substrate;

a source contact plug spaced apart from the second substrate on an external side of the second substrate and having an upper surface having a level higher than a level of the upper surface of the second substrate and a lower surface having a level lower than a level of a lower surface of a lowermost gate electrode, among the gate electrodes, based on an upper surface of the first substrate; and a source connection pattern in contact with an upper surface of each of the via patterns and the upper surface of the source contact plug.

13. The semiconductor device of claim 12, wherein the upper surface of the source contact plug has a width narrower than a width of the lower surface of the source contact plug, and each of the via patterns has a lower portion and an upper portion, the upper portion of each via pattern having a width narrower than a width of the lower portion of the via pattern.

14. The semiconductor device of claim 12, wherein the upper surface of the source contact plug is at a same level as an upper surface of at least one of the via patterns, based on the upper surface of the first substrate.

15. The semiconductor device of claim 12, wherein the source connection pattern has a mesh-type pattern on the upper surface of the second substrate.

16. The semiconductor device of claim 12, wherein the source connection pattern includes first patterns, extending in a first direction, and second patterns, extending in a second direction while intersecting the first patterns, in a plan view.

17. The semiconductor device of claim 16, wherein at least one pattern of the first patterns and the second patterns extends an extension portion extending in a direction farther away from the second substrate than an external end portion of the second substrate, and the upper surface of the source contact plug is in contact with the extension portion of the source connection pattern.

18. The semiconductor device of claim 16, wherein the via patterns are connected to at least one pattern of the first patterns and the second patterns.

19. A data storage system, comprising:

a semiconductor storage device including a first semiconductor structure including a first substrate and circuit devices on the first substrate, a second semiconductor structure including a second substrate, gate electrodes spaced apart from each other and stacked below the second substrate, and channel structures penetrating through the gate electrodes, and an input/output pad electrically connected to the circuit devices; and a controller electrically connected to the semiconductor storage device through the input/output pad and configured to control the semiconductor storage device, wherein the first semiconductor structure further includes a lower interconnection structure electrically connected to the circuit devices, and a lower bonding structure connected to the lower interconnection structure, and wherein the second semiconductor structure further includes an upper bonding structure bonded to the lower bonding structure, an upper interconnection structure connected to the upper bonding structure, via patterns on an upper surface of the second substrate, the upper surface of the second substrate opposite a lower surface of the second substrate, the lower surface of the second substrate facing the first substrate, a source connection pattern configured to be in contact with an upper surface of each of the via patterns and including an overlapping portion that overlaps the second substrate in a vertical direction that is perpendicular the lower surface of the second substrate, and an extension portion that extends from the overlapping portion in a horizontal direction that is parallel to the lower surface of the second substrate, and a source contact plug connected to the upper interconnection structure, spaced apart from the second substrate on an external side of the second substrate, and extending in the vertical direction to be in contact with the extension portion of the source connection pattern.

20. The data storage system of claim 19, wherein the source contact plug overlaps the extension portion of the source connection pattern in the vertical direction, and an upper surface of the source contact plug, in contact with the extension portion of the source connection pattern, is disposed at a level higher than a level of the upper surface of the second substrate, based on an upper surface of the first substrate.

* * * * *